(12) United States Patent
Kim et al.

(10) Patent No.: US 9,224,743 B2
(45) Date of Patent: Dec. 29, 2015

(54) NONVOLATILE MEMORY DEVICE

(71) Applicant: SK hynix Inc., Gyeonggi-do (KR)

(72) Inventors: Nam Yoon Kim, Chungcheongbuk-do (KR); Sung Kun Park, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/495,624

(22) Filed: Sep. 24, 2014

(65) Prior Publication Data

US 2015/0303208 A1  Oct. 22, 2015

(30) Foreign Application Priority Data

Apr. 21, 2014 (KR) .................. 10-2014-0047295

(51) Int. Cl.
*H01L 29/66* (2006.01)
*H01L 27/108* (2006.01)
*H01L 29/788* (2006.01)
*H01L 27/12* (2006.01)
*H01L 27/115* (2006.01)
*H01L 49/02* (2006.01)
*H01L 27/06* (2006.01)
*H01L 29/06* (2006.01)
*H01L 29/861* (2006.01)
*H01L 23/528* (2006.01)

(52) U.S. Cl.
CPC ........ *H01L 27/11524* (2013.01); *H01L 23/528* (2013.01); *H01L 27/0629* (2013.01); *H01L 28/40* (2013.01); *H01L 29/0642* (2013.01); *H01L 29/861* (2013.01)

(58) Field of Classification Search
CPC ............ H01L 27/115; H01L 27/11521; H01L 27/11558; H01L 21/70; H01L 21/8247; H01L 29/7885
USPC ............ 257/270, 321, E21.694, 317, 68, 315, 257/298, 350; 438/257, 201, 261, 586; 365/51
See application file for complete search history.

(56) References Cited

U.S. PATENT DOCUMENTS

| | | | |
|---|---|---|---|
| 5,998,830 A * | 12/1999 | Kwon ........................... 257/315 |
| 6,044,018 A * | 3/2000 | Sung et al. ............... 365/185.18 |
| 6,177,703 B1 | 1/2001 | Cunningham | |
| 6,204,530 B1 * | 3/2001 | Choi ............................. 257/315 |
| 2001/0033513 A1 * | 10/2001 | Sung et al. ............... 365/185.18 |
| 2009/0201742 A1 * | 8/2009 | Lee et al. ................. 365/185.24 |

* cited by examiner

*Primary Examiner* — Long K Tran
*Assistant Examiner* — Dzung Tran
(74) *Attorney, Agent, or Firm* — IP & T Group LLP

(57) ABSTRACT

A nonvolatile memory device includes a first active region and a second active region separated from each other; a floating gate crossing the first active region, and disposed such that an end thereof overlaps with the second active region; a selection gate crossing the first active region, and disposed side by side with and coupled to the floating gate; a dielectric layer disposed between the floating gate and the selection gate, wherein a stack of the dielectric layer, the floating gate and the selection gate forms a first capacitor in a horizontal structure; a well region disposed in the second active region and coupled to the floating gate, wherein a stack of the well region and the floating gate forms a second capacitor in a vertical structure; and a contact commonly coupled to the well region and the selection gate.

20 Claims, 16 Drawing Sheets

FIG.6

|  | WL | SL | BL |
|---|---|---|---|
| PROGRAM | $+V_{pp}$ | $+V_{sp}$ | GND |
| ERASURE | $-V_{ee}$ | $+V_{se}$ | GND |
| READ | $+V_{read}$ | GND | $+V_{dr}$ |

FIG.8

| | | PROGRAM | ERASURE | READ |
|---|---|---|---|---|
| UNIT CELL (100A) | WL2 | $+V_{pp}$ | $-V_{ee}$ | $+V_{read}$ |
| | SL2 | $+V_{sp}$ | $+V_{se}$ | GND |
| | BL3 | GND | GND | $+V_{dr}$ |
| UNIT CELL (100B) | WL2 | $+V_{pp}$ | $-V_{ee}$ | $+V_{read}$ |
| | SL2 | $+V_{sp}$ | $+V_{se}$ | GND |
| | BL2 | FLOATED | GND | GND |
| UNIT CELL (100C) | WL3 | GND | $-V_{ee}$ | GND |
| | SL3 | GND | $+V_{se}$ | GND |
| | BL3 | GND | GND | $+V_{dr}$ |

FIG.17

|  | WL | SL | BL | WBL |
|---|---|---|---|---|
| PROGRAM | $+V_{pp}$ | $+V_{sp}$ | GND | $+V_{wp}$ |
| ERASURE | $-V_{ee}$ | FLOATED | FLOATED | $+V_{we}$ |
| READ | GND | $+V_{sr}$ | $+V_{dr}$ | $+V_{wr}$ |

NONVOLATILE MEMORY DEVICE

CROSS-REFERENCE TO RELATED APPLICATION

This patent document claims priority under 35 U.S.C. §119(a) to Korean application number 10-2014-0047295 filed on Apr. 21, 2014 in the Korean Intellectual Property Office, which is incorporated herein by reference in its entirety.

BACKGROUND

1. Technical Field

Embodiments relate to a nonvolatile memory device, and more particularly, to a nonvolatile memory device which has a single-layered gate.

2. Related Art

Various structures have been suggested for the memory cell of a nonvolatile memory device capable of electrically programming and erasing data, for example, an EEPROM. In nonvolatile memory devices, the data stored in a memory cell is not erased and is retained even when power is interrupted. In the conventional art, a stacked gate structure has been generally adopted as the EEPROM memory cell structure. The stacked gate structure includes a floating gate for storing data and a control gate formed over the floating gate. A dielectric layer is interposed between the floating gate and the control gate. Recently, as the size of electronic devices has decreased and fabrication technologies for semiconductor devices are developed, a system-on-chip (SOC) has been highlighted as a key part of an up-to-date digital product. In a SOC, various types of semiconductor devices are installed in a single semiconductor chip so that the chip can perform various functions. For example, logic devices and memory devices may be formed together in a single semiconductor chip. Accordingly, fabrication technologies for an embedded type EEPROM, which is embedded in a system-on-chip (SOC), is in demand.

In order to fabricate an embedded type EEPROM, logic devices and an EEPROM are fabricated through the same processing steps. Logic devices generally adopt transistors with a single gate structure. In contrast, an EEPROM generally employs a stacked gate structure. Therefore, fabrication procedures for integrating an EEPROM along with logic devices in the same substrate are complicated. In order to address this issue, a single-layered-gate EEPROM has been increasingly adopted as for embedded type EEPROM. In the case where the single-layered-gate EEPROM is formed by using a general CMOS (complementary metal oxide semiconductor) process, which is employed to fabricate logic devices, a system-on-chip (SOC) may be easily realized.

SUMMARY

Embodiments show a nonvolatile memory device which has a single-layered gate.

According to an embodiment, a nonvolatile memory device includes: a first active region and a second active region separated from each other; a floating gate crossing the first active region, and disposed such that an end thereof overlaps with the second active region; a selection gate crossing the first active region, and disposed side by side with and coupled to the floating gate; a dielectric layer disposed between the floating gate and the selection gate, wherein a stack of the dielectric layer, the floating gate and the selection gate forms a first capacitor in a horizontal structure; a well region disposed in the second active region and coupled to the floating gate, wherein a stack of the well region and the floating gate forms a second capacitor in a vertical structure; and a contact commonly coupled to the well region and the selection gate.

According to an embodiment, a nonvolatile memory device includes: a first active region disposed in a first direction; a second active region and a third active region separated from the first active region, and respectively disposed on opposite sides of the first active region when shown from a second direction, wherein the second direction is substantially perpendicular to the first direction; a floating gate crossing the first active region, wherein both ends of the floating gate respectively overlap with the second active region and the third active region; a selection gate crossing the first active region, and disposed side by side with the floating gate; a dielectric layer disposed between the floating gate and the selection gate, and constituting a first capacitor configured in a horizontal structure together with the floating gate and the selection gate; a first well region disposed in the second active region to overlap with the floating gate, and constituting a second capacitor configured in a vertical structure together with the floating gate; a second well region disposed in the third active region to overlap with the floating gate, and constituting a third capacitor configured in the vertical structure together with the floating gate; a first contact commonly coupled to the first well region and the selection gate; and a second contact commonly coupled to the second well region and the selection gate.

In an embodiment, a nonvolatile memory device includes: a first well region and a second well region disposed to be separated from each other, wherein the first well region has a first conductivity and the second well region has a second conductivity; a first active region and a first contact region disposed in the first well region and separated from each other, wherein the first contact region has the second conductivity; a second active region disposed in the second well region; a second contact region disposed in the second active region, wherein the second contact region has the first conductivity; a floating gate crossing the first active region, wherein an end of the floating gate overlaps with the second well region in the second active region; a selection gate crossing the first active region, and disposed side by side with the floating gate; a dielectric layer disposed between the floating gate and the selection gate; and a contact commonly coupled to the second contact region and the selection gate.

According to an embodiment, a nonvolatile memory device includes: a charge storage transistor including a floating gate, a first junction region which is coupled to a source line, and a third junction region; a selection transistor including a selection gate which is coupled to a word line, a second junction region which is coupled to a bit line, and the third junction region which is shared by the charge storage transistor; a first capacitor component disposed between a terminal of the selection gate and a terminal of the floating gate; and a diode component and a second capacitor component disposed in series between the terminal of the selection gate and the terminal of the floating gate.

According to an embodiment, a nonvolatile memory device includes: a charge storage transistor including a floating gate, a first junction region which is coupled to a source line, and a third junction region; a selection transistor including a selection gate which is coupled to a word line, a second junction region which is coupled to a bit line, and the third junction region which is shared by the charge storage transistor; a first capacitor component disposed between a terminal of the selection gate and a terminal of the floating gate; a first diode component and a second capacitor component disposed in series between the terminal of the selection gate and the terminal of the floating gate; and a second diode component and a third capacitor component disposed in series between the terminal of the selection gate and the terminal of the floating gate.

According to an embodiment, a nonvolatile memory device includes: a floating gate and a selection gate extending side by side; a horizontal capacitor provided between the floating gate and the selection gate; a first diode; a first vertical capacitor provided between the first diode and the floating gate.

BRIEF DESCRIPTION OF THE DRAWINGS

FIG. 6 is a table explaining the operations of the unit cell of the nonvolatile memory device shown in FIGS. 1 to 4.

FIG. 8 is a table explaining the operations of the cell array of the nonvolatile memory device shown in FIG. 7.

FIG. 17 is a table explaining the operations of the unit cell of the nonvolatile memory device shown in FIGS. 12 to 15.

DETAILED DESCRIPTION

Hereinafter, a nonvolatile memory device will be described below with reference to the accompanying drawings through various examples of embodiments.

According to the embodiments, coupling voltage is obtained by both a horizontal capacitor and a vertical capacitor. The horizontal capacitor includes a selection gate, a dielectric layer and a floating gate which are horizontally arranged. When bias voltage is applied to the selection gate, first coupling voltage is induced at the floating gate by the horizontal capacitor. In addition, second coupling voltage is induced at the floating gate by the vertical capacitor, as well. When the bias voltage is applied to the selection gate, the bias voltage is transferred to a well region through a contact region which shares a contact with the selection gate. The well region forms the vertical capacitor along with an insulation layer and the floating gate. As a result, upon application of the bias voltage, the second coupling voltage is induced at the floating gate through the vertical capacitor. As a consequence, an advantage is provided in that the entire coupling ratio may be increased. Moreover, since the area occupied by active regions in unit cell is increased compared with the area occupied by isolation region(s), a planarization process made in the course of forming the active region can be easily performed without losing or damaging the active region.

It will be understood that when an element is referred to as being located "on", "over", "above", "under", "beneath" or "below" another element, it can directly contact the other element, or at least one intervening element may be present therebetween. Accordingly, the terms such as "on", "over", "above", "under", "beneath", "below" and the like are not intended to be restrictive.

Figure 1:
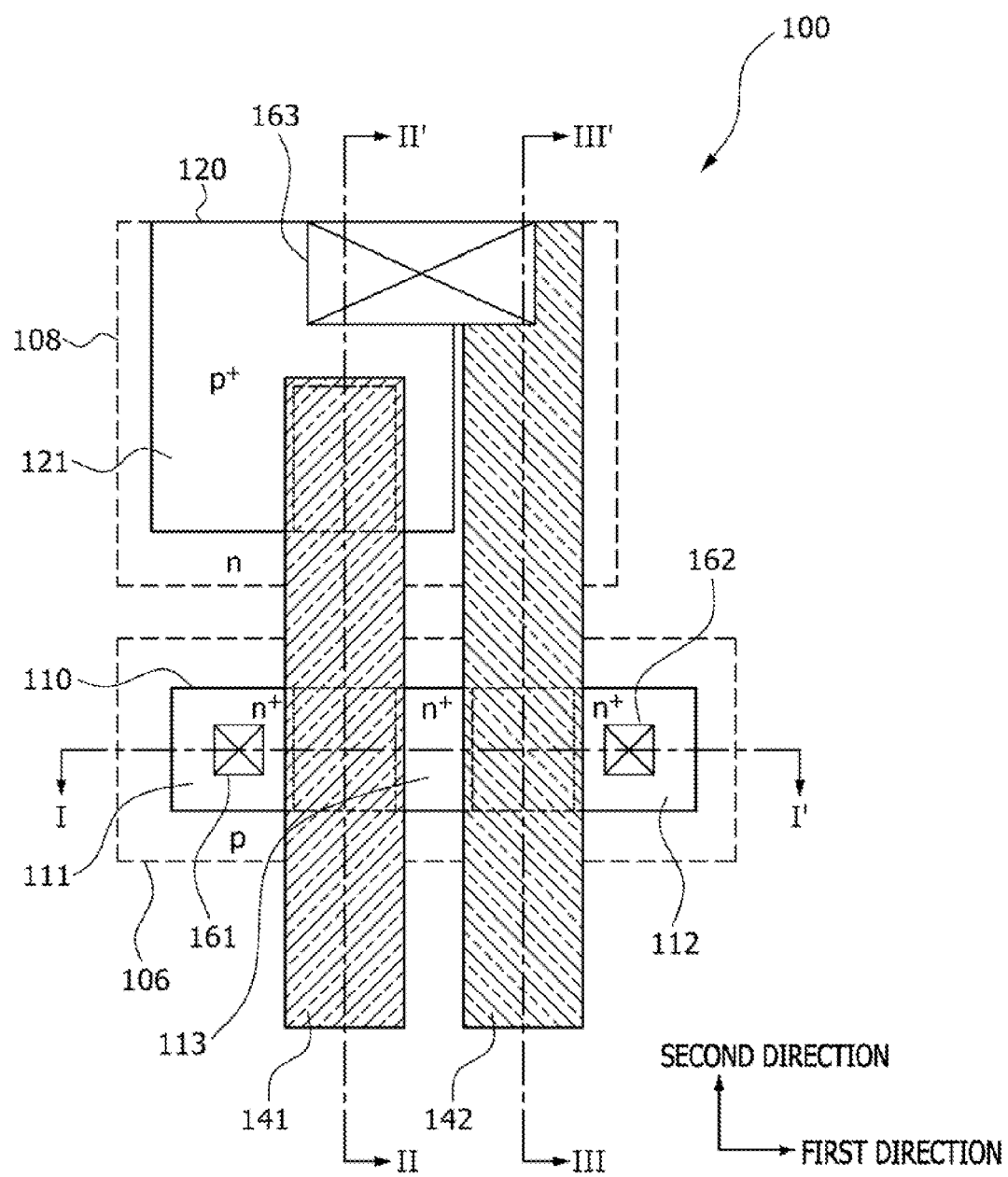
FIG. 1 is a layout diagram showing a unit cell of a nonvolatile memory device in accordance with an embodiment.

FIG. 1 is a layout diagram showing a unit cell of a nonvolatile memory device in accordance with an embodiment. In this embodiment, a unit cell 100 of a nonvolatile memory device includes a storage transistor and a selection transistor which are configured as an n channel type MOS structure. Referring to FIG. 1, the unit cell 100 of the nonvolatile memory device has a first active region 110, a first gate 141, and a second gate 142. The first active region 110, the first gate 141, and the second gate 142 may be arranged as illustrated in a plan view of FIG. 1. The first active region extends in a first direction. Although not shown in the drawing, the first active region 110 may be defined by an isolation layer. The first active region 110 is disposed in a first well region 106. The first well region 106 has a p-type conductivity. A first gate 141 is disposed in form of stripe which extends in a direction crossing the first active region 110. That is, the first gate 141 extends in a second direction crossing the first direction. A second gate 142 is disposed also in the form of stripe which extends in the second direction crossing the first active region 110. Center lines running along a length of the first gate 141 and the second gate 142 may be disposed substantially perpendicular to a center line running along a length of the first active region 110. The first gate 141 may serve as a floating gate of a charge storage transistor, and the second gate 142 may serve as a selection gate of a selection transistor. Although not shown in the drawing, a first insulation layer may be disposed under the first gate 141, and a second insulation layer may be disposed under the second gate 142. The length of the second gate 142 measured along the second direction may be longer than the length of the first gate 141 measured along the second direction. The first gate 141 and the second gate 142 may include a conductive material layer, for example, a polysilicon layer or a metal layer. The first gate 141 and the second gate 142 are disposed to be separated from each other. Although not shown in the drawing, a dielectric layer may be disposed between the first gate 141 and the second gate 142. The first gate 141, the dielectric layer and the second gate 142 may constitute a first capacitor. The first capacitor extends in a horizontal direction with respect to a surface of the unit cell. That is, the first capacitor is formed in parallel to the surface of the unit cell.

A first junction region 111, a second junction region 112 and a third junction region 113 are disposed in the first active region 110 and separated from one another by the first gate 141 and the second gate 142. The first junction region 111 and the second junction region 112 are respectively disposed at both ends of the first active region 110 in the first direction. The third junction region 113 is disposed between the first junction region 111 and the second junction region 112 and separated from the first junction region 111 and the second junction region 112. That is, the first gate 141 and the second gate 142 trisect the active region 110 into first junction region 111, the second junction region 112, and the third junction region 113. The first junction region 111, the second junction region 112 and the third junction region 113 each have n+ type conductivity. In an embodiment, the first junction region 111 may serve as a source region, and the second junction region 112 may serve as a drain region. The first well region 106 which overlaps with the first gate 141 between the first junction region 111 and the third junction region 113 serves as a first channel region. The first well region 106 which overlaps with the second gate 142 between the second junction region 112 and the third junction region 113 serves as a second channel region.

The unit cell 100 of the nonvolatile memory device further has a second well region 108 which is disposed to be separated from the first well region 106 by a predetermined gap in the second direction. A second active region 120, which is defined by the isolation layer, is disposed in the second well region 108. The second well region 108 has n-type conductivity. The second active region 120 overlaps with one end of the first gate 141 in the second direction. While the second active region 120 may have a quadrangular planar structure, in an example, the second active region 120 may have a planar structure different than the quadrangular planar structure. A contact region 121 is disposed in the second active region 120. The contact region 121 has p+ type conductivity. The contact region 121 may be formed by implanting impurity ions through using the first gate 141 as an ion implantation mask. In this case, the contact region 121 may extend under edges of the first gate 141. Further, in the second active region 120, the second well region 108 overlaps with the first gate 141. The second well region 108 which overlaps with the first gate 141, the first insulation layer and the first gate 141 may constitute a second capacitor. The second capacitor extends in the vertical direction, i.e., in a bottom-to-top direction, with respect to the surface of the unit cell. That is, the second capacitor is formed perpendicular to the surface of the unit cell.

A first contact 161 is disposed in the first junction region 111. The first contact 161 may be electrically, magnetically, or electromagnetically coupled with a line for applying a bias to the first junction region 111. A second contact 162 is disposed in the second junction region 112. The second contact 162 may be electrically, magnetically, or electromagnetically coupled with a line for applying a bias to the second junction region 112. A third contact 163 is disposed on the contact region 121 and the second gate 142. The third contact 163 may be electrically, magnetically, or electromagnetically coupled with a line for applying a bias to the second gate 142 and the contact region 121. As the contact region 121 and the second gate 142 share the one third contact 163, the bias applied through the third contact 163 may be applied to the contact region 121 and the second gate 142 in substantially the same manner.

Figure 2:
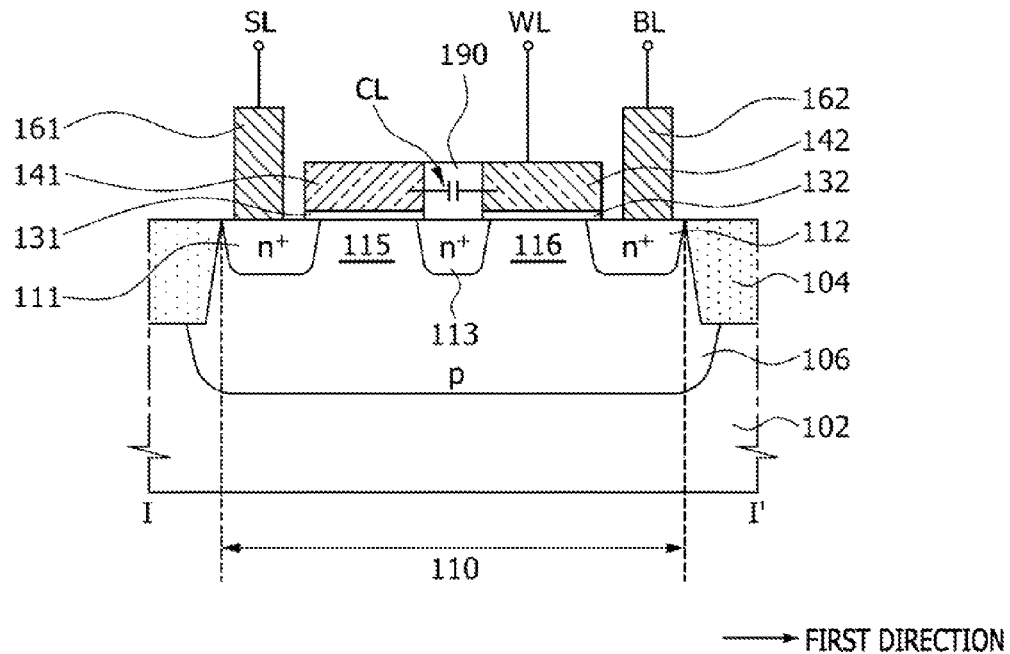
FIG. 2 is a cross-sectional view taken along the line I-I' of FIG. 1.
Figure 3:
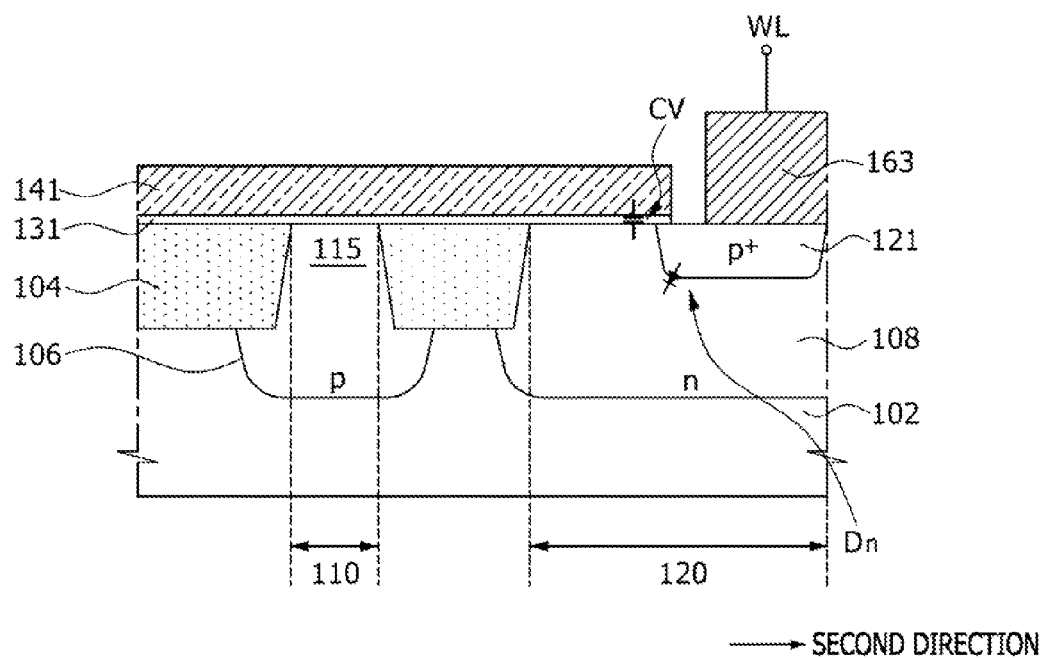
FIG. 3 is a cross-sectional view taken along the line II-II' of FIG. 1.
Figure 4:
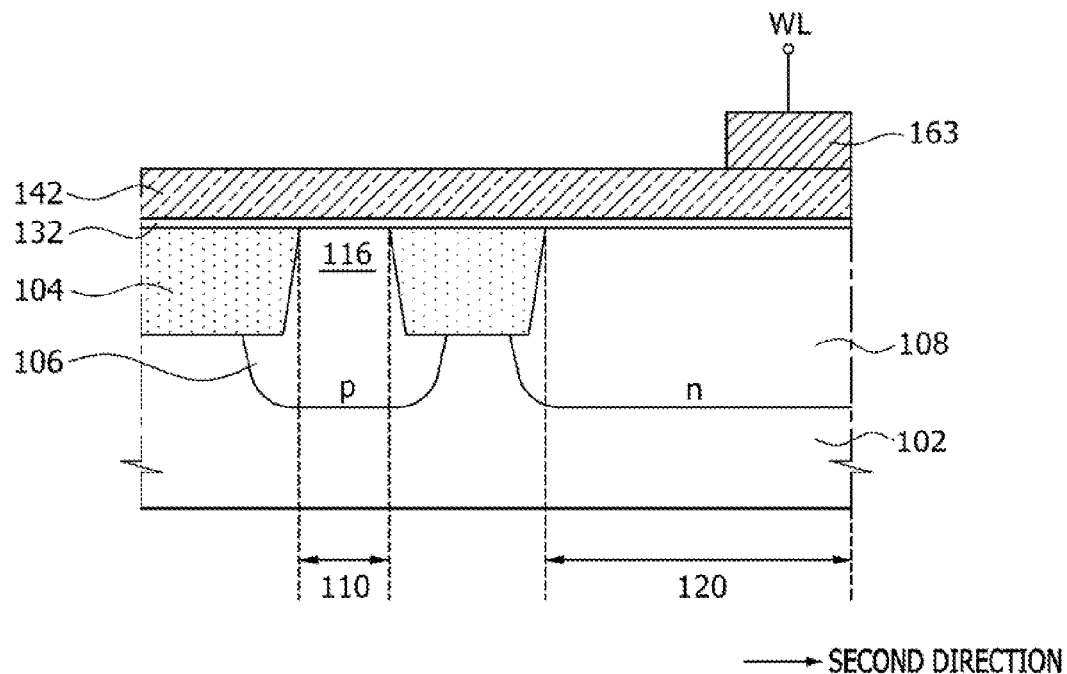
FIG. 4 is a cross-sectional view taken along the line III-III' of FIG. 1.

FIGS. 2 to 4 are cross-sectional views respectively taken along the lines I-I', II-II' and III-III' of FIG. 1. First, referring to FIG. 2 along with FIG. 1, an isolation layer 104 is disposed in a substrate 102. The first active region 110 is defined by the isolation layer 104. The first well region 106 with p type conductivity is disposed in the substrate 102. In an example, when the substrate 102 is a semiconductor substrate which has p type conductivity, the first well region 106 may be omitted. The first junction region 111, the second junction region 112 and the third junction region 113 each which have the n+ type conductivity are disposed in the first well region 106 to be separated from one another. The first junction region 111 and the second junction region 112 are disposed on both sides of the first well region 106, and the third junction region 113 is disposed between the first junction region 111 and the second junction region 112. The upper portion of the first well region 106 between the first junction region 111 and the third junction region 113 may serve as a first channel region 115. The upper portion of the first well region 106 between the second junction region 112 and the third junction region 113 may serve as a second channel region 116.

A first insulation layer 131 and the first gate 141 are disposed on the first channel region 115. A second insulation layer 132 and the second gate 142 are disposed on the second channel region 116. A dielectric layer 190 is disposed between the first gate 141 and the second gate 142. The first capacitor CL may include the first gate 141, the dielectric layer 190 and the second gate 142. The first gate 141 may be disposed in a floating state, and the second gate 142 may be connected to a word line WL. The first junction region 111 may be connected to a source line SL through the first contact 161, and the second junction region 112 may be connected to a bit line BL through the second contact 162.

Next, referring to FIGS. 3 and 4 along with FIG. 1, the first active region 110 and the second active region 120 are defined in the substrate 102 by the isolation layer 104. In the substrate 102, the first active region 110 is surrounded by the first well region 106, and the second active region 120 is surrounded by the second well region 108. The second well region 108 has n type conductivity. As shown in FIG. 3, the contact region 121 is disposed in an upper portion of the second well region 108. The contact region 121 has p+ type conductivity. The contact region 121 of p+ type conductivity and the second well region 108 of n type conductivity may constitute a pn diode Dn. The first insulation layer 131 and the first gate 141 extend in the second direction. The first channel region 115 is disposed in a region where the first active region 110 and the first gate 141 overlap with each other. The third contact 163 is disposed on the contact region 121. The third contact 163 may be connected to the word line WL. The first gate 141, the first insulation layer 131 and the second well region 108 may constitute a second capacitor CV. As shown in FIG. 4, the second insulation layer 132 and the second gate 142 extend in the second direction. The third contact 163 is disposed on the end of the second gate 142, and may be connected to the word line WL.

Figure 5:
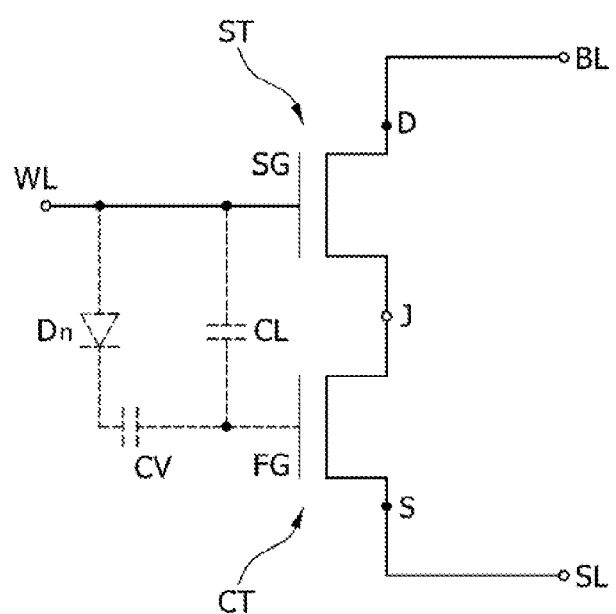
FIG. 5 is an equivalent circuit diagram of the unit cell of the nonvolatile memory device shown in FIGS. 1 to 4.

FIG. 5 is an equivalent circuit diagram of the unit cell of the nonvolatile memory device which has the single-layered gate, described above with reference to FIGS. 1 to 4. Referring to FIG. 5 along with FIGS. 1 to 4, a storage transistor CT and a selection transistor ST are connected in series. The storage transistor CT may be constituted by the first gate 141, the first junction region 111 and the third junction region 113. The selection transistor ST may be constituted by the second gate 142, the second junction region 112 and the third junction region 113. The storage transistor CT and the selection transistor ST share the third junction region 113. In the equivalent circuit diagram of FIG. 5, the storage transistor CT has a floating gate terminal FG, a source terminal S and a junction terminal J. The floating gate terminal FG of the storage transistor CT corresponds to the first gate 141 of FIGS. 1 to 3. The source terminal S and the junction terminal 3 of the storage transistor CT respectively correspond to the first junction region 111 and the third junction region 113 of FIGS. 1 and 2. The source terminal S of the storage transistor CT is connected to the source line SL. The selection transistor ST has a selection gate terminal SG, a drain terminal D and the junction terminal 3. The selection gate terminal SG of the selection transistor ST corresponds to the second gate 142 of FIGS. 1 and 4 and is connected to the word line WL. The drain terminal D and the junction terminal J of the selection transistor ST respectively correspond to the second junction region 112 and the third junction region 113 of FIGS. 1 and 2. The drain terminal D of the selection transistor ST is connected to the bit line BL.

As described above with reference to FIG. 2, the first gate 141, the dielectric layer 190 and the second gate 142 constitute the first capacitor CL. In the equivalent circuit diagram of FIG. 5, both terminals of the first capacitor CL are connected between the selection gate terminal SG of the selection transistor ST and the floating gate terminal FG of the storage transistor CT. As described above with reference to FIG. 3, the first gate 141, the first insulation layer 131 and the second well region 108 constitute the second capacitor CV. Further, the contact region 121 and the second well region 108 constitute the pn diode Dn. In the equivalent circuit diagram of FIG. 5, one terminal of the second capacitor CV is connected to the floating gate terminal FG of the storage transistor CT, and the other terminal of the second capacitor CV is connected to the cathode of the pn diode Dn. The anode of the pn diode Dn is connected to the selection gate terminal SG of the selection transistor ST and the word line WL. The first capacitor CL and the second capacitor CV are connected in parallel. The bias voltage applied to the word line WL is transferred to the floating gate terminal FG of the storage transistor CT through the first capacitor CL. Moreover, the bias voltage applied to the word line WL is transferred to the floating gate terminal FG of the storage transistor CT through the second capacitor CV as well.

FIG. 6 is a table explaining the operations of the unit cell of the nonvolatile memory device which has the single-layered gate, described above with reference to FIGS. 1 to 4. Referring to FIG. 6, program operations of the unit cell 100 of the nonvolatile memory device which has the single-layered gate may be performed in a hot electron injection scheme. Erasure operation of the unit cell 100 of the nonvolatile memory device which has the single-layered gate may be performed in a band-to-band tunneling (BTBT) scheme. In detail, in order to program the unit cell 100 of the nonvolatile memory device which has the single-layered gate, a positive program voltage +Vpp is applied to the word line WL, the bit line BL is connected to the ground GND, and a positive source voltage +Vsp is applied to the source line SL. In an example, the program voltage +Vpp may be approximately 6V to approximately 10V, for example, approximately 8V. In an example, the source voltage +Vsp may be approximately 3V to approximately 5V, for example, approximately 4V. As shown in FIG. 4, since the third contact 163 connected to the word line WL contacts the second gate 142, the program voltage +Vpp applied to the word line WL is applied to the second gate 142 through the third contact 163.

As the program voltage +Vpp is applied to the second gate 142, a first coupling voltage, which is horizontally coupled to the program voltage +Vpp, is induced in the first gate 141 through the first capacitor CL described above with reference to FIG. 2. Also, the program voltage +Vpp applied to the second gate 142 is transferred to the second well region 108 through the pn diode Dn described above with reference to FIG. 3. In this embodiment, a voltage drop by the bulk resistance of the pn diode Dn will be neglected. As the program voltage +Vpp is transferred to the second well region 108, a second coupling voltage, which is vertically coupled with the program voltage +Vpp transferred to the second well region 108, is induced in the first gate 141 through the second capacitor CV. In this way, as the first coupling voltage and the second coupling voltage are induced in the first gate 141 through the first capacitor CL and the second capacitor CV and the source voltage +Vsp with a predetermined magnitude is applied through the source line SL, hot electrons are produced around the first junction region 111. The hot electrons are stored in the first gate 141 by passing through the first insulation layer 131 by the first coupling voltage and the second coupling voltage induced in the first gate 141. Accordingly, the unit cell 100 is placed in a programmed state.

In order to erase the unit cell 100 of the nonvolatile memory device which has the single-layered gate, a negative erase voltage −Vee is applied to the word line WL, the bit line BL is connected to the ground GND, and a positive source voltage +Vse is applied to the source line SL. In an example, the erase voltage −Vee may be approximately −6V to approximately −10V, for example, approximately −8V. In an example, the source voltage +Vse may be approximately 5V to approximately 6V, for example, approximately 5.5V. As shown in FIG. 4, since the third contact 163 connected to the word line WL contacts the second gate 142, the erasure voltage −Vee applied to the word line WL is applied to the second gate 142 through the third contact 163.

As the erasure voltage −Vee is applied to the second gate 142, as shown in FIG. 2, a voltage coupled with the erasure voltage −Vee is induced in the first gate 141 through the first capacitor CL. As the erasure voltage −Vee is applied to the second gate 142, a negative coupling voltage horizontally coupled to the erasure voltage −Vee is induced in the first gate 141 through the first capacitor CL described above with reference to FIG. 2. As the negative coupling voltage is induced in the first gate 141 and the source voltage +Vse with a predetermined magnitude is applied through the source line SL, the electrons stored in the first gate 141 tunnel to the first junction region 111 by passing through the first insulation layer 131. Accordingly, the unit cell 100 is placed in an erased state. In the erasure process, a reverse bias may be applied to the pn diode Dn described above with reference to FIG. 3 to prevent a voltage coupled to the first gate 141 from being induced by the second capacitor CV.

In order to perform a read operation of the unit cell 100 of the nonvolatile memory device which has the single-layered gate, a positive read voltage +Vread is applied to the word line WL, a positive drain voltage +Vdr is applied to the bit line BL, and the source line SL is connected to the ground GND. In an example, the read voltage +Vread may be approximately 2.8V to approximately 3.8V, for example, approximately 3.3V. In an example, the drain voltage +Vdr may be approximately 0.5V to approximately 1.5V, for example, approximately 1V. As shown in FIG. 4, since the third contact 163 connected to the word line WL contacts the second gate 142, the read voltage +Vread applied to the word line WL is applied to the second gate 142 through the third contact 163. By the read voltage +Vread applied to the second gate 142, an inversion layer is formed in the second channel region 116, and a current path is formed between the second junction region 112 and the third junction region 113. Thus, the drain voltage +Vdr applied to the bit line BL is transferred to the third junction region 113.

As the read voltage +Vread is applied to the second gate 142, a first coupling voltage which is horizontally coupled to the read voltage +Vread is induced in the first gate 141 through the first capacitor CL, as described above with reference to FIG. 2. Further, the read voltage +Vread is applied to the second well region 108 through the pn diode Dn, as described above with reference to FIG. 3. In this embodiment, a voltage drop by the bulk resistance of the pn diode Dn will be neglected. As the read voltage +Vread is applied to the second well region 108, a second coupling voltage which is vertically coupled with the read voltage +Vread is induced in the first gate 141 through the second capacitor CV. In this way, as the first coupling voltage and the second coupling voltage are induced in the first gate 141 respectively through the first capacitor CL and the second capacitor CV and the drain voltage +Vdr is transferred to the third junction region 113, an inversion layer may be formed in the first channel region 115 between the first junction region 111 and the third junction region 113, depending on whether electrons are stored in the first gate 141. For example, when electrons are stored in the first gate 141, the inversion layer is not formed in the first channel region 115. Conversely, when electrons are not stored in the first gate 141, the inversion layer is formed in the first channel region 115. If the inversion layer is formed in the first channel region 115, current flows from the first junction region 111 through the third junction region 113 to the second junction region 112, and a sense amplifier which is connected to the bit line BL connected to the second junction region 112 senses the current and may determine whether the unit cell 100 is programmed or erased.

Figure 7:
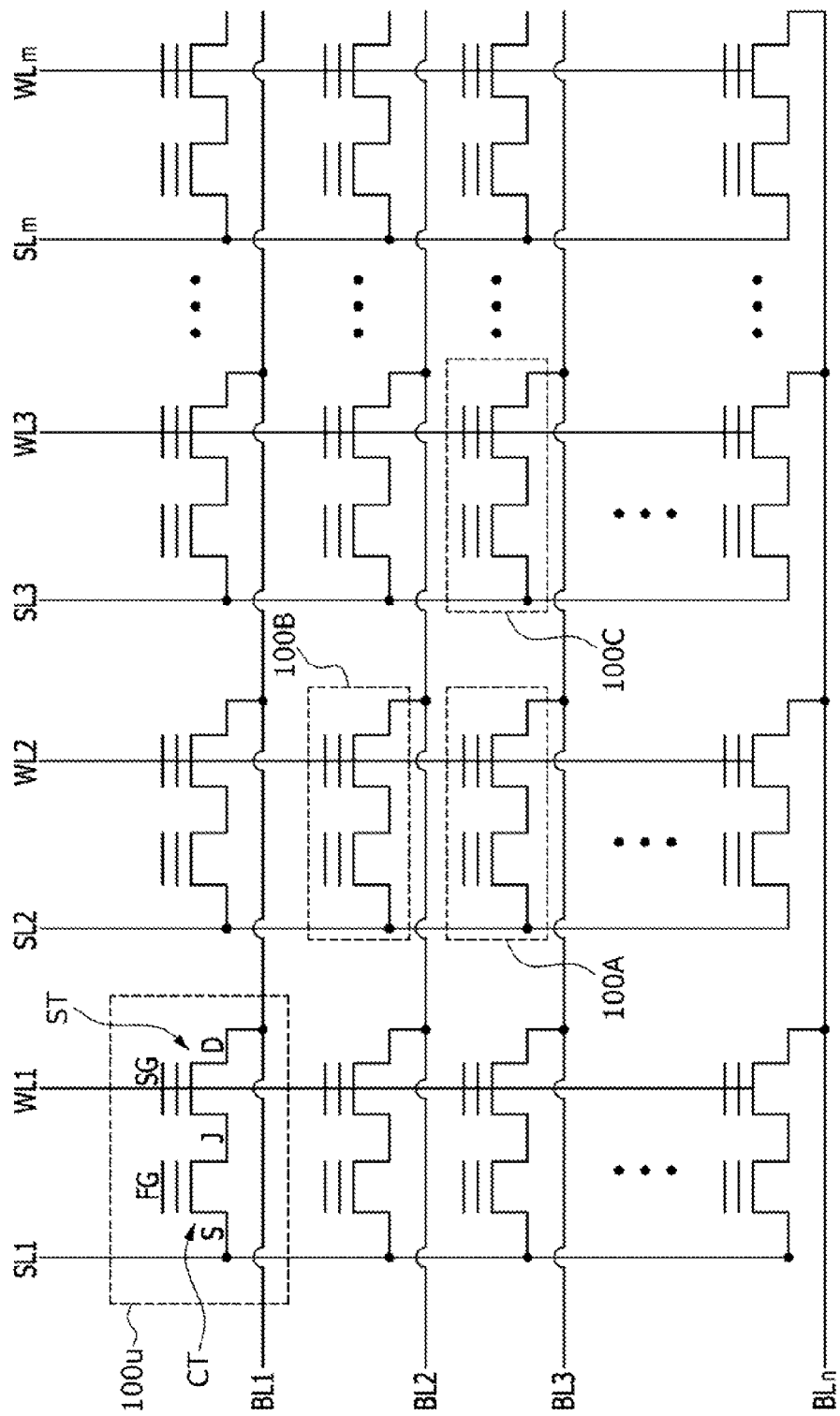
FIG. 7 is a diagram showing the cell array of the nonvolatile memory device shown in FIGS. 1 to 4.

FIG. 7 is a diagram showing a cell array of the nonvolatile memory device which has the single-layered gate, described above with reference to FIGS. 1 to 4. Referring to FIG. 7, in the cell array of the nonvolatile memory device which has the single-layered gate, unit cells 100u are disposed in an n×m array in the transverse and longitudinal directions. As described above with reference to FIG. 5, each of the unit cells 100u has a structure in which a storage transistor CT having a source terminal S and a floating gate terminal FG and a selection transistor ST having a drain terminal D and a selection gate terminal SG are connected in series while sharing a junction terminal J. As such unit cells 100u are repeatedly arranged n times in rows and are repeatedly arranged m times in columns, and the cell array of an n×m matrix is formed. The drain terminals D of the unit cells 100u of a first row are commonly connected to a first bit line BL1. The drain terminals D of the unit cells 100u of a second row are commonly connected to a second bit line BL2. The drain terminals D of the unit cells 100u of a third row are commonly connected to a third bit line BL3. Similarly, the drain terminals D of the unit cells 100u of an $n^{th}$ row are commonly connected to an $n^{th}$ bit line BLn.

The source terminals S and the selection gate terminals SG of the unit cells 100u of a first column are commonly connected to a first source line SL1 and a first word line WL1, respectively. The source terminals S and the selection gate terminals SG of the unit cells 100u of a second column are commonly connected to a second source line SL2 and a second word line WL2, respectively. The source terminals S and the selection gate terminals SG of the unit cells 100u of a third column are commonly connected to a third source line SL3 and a third word line WL3, respectively. Similarly, the source terminals S and the selection gate terminals SG of the unit cells 100u of an $m^{th}$ column are commonly connected to an $m^{th}$ source line SLm and an $m^{th}$ word line WLm, respectively.

In the cell array of FIG. 7, in the case where a unit cell 100A which is positioned at the crossing point of the third row and the second column is selected, all unit cells disposed in the second column, including a unit cell 100B which is positioned at the crossing point of the second row and the second column, share the word line WL2 and the source line SL2 with the selected unit cell 100A. Moreover, all unit cells disposed in the third row, including a unit cell 100C which is positioned at the crossing point of the third row and the third column, share the bit line BL3 with the selected unit cell 100A.

FIG. 8 is a voltage condition table explaining the operations of the cell array shown in FIG. 7. Referring to FIG. 8 along with FIG. 7, in the cell array of the nonvolatile memory device which has the single-layered gate, according to an embodiment, program operations and read operations are performed for a selected unit cell without disturbance. However, an erasure operation is collectively performed for the entire unit cells 100u. In order to describe the program and read operations for a selected unit cell, it is assumed that the unit cell 100A which is positioned at the crossing point of the third row and the second column is the selected. In order to program the selected unit cell 100A, the positive program voltage +Vpp and the positive source voltage +Vsp are respectively applied to the word line WL2 and the source line SL2, which are connected to the selected unit cell 100A. The bit line BL3 is connected to the ground GND. The remaining word lines WL1, WL3, . . . and WLm and source lines SL1, SL3, . . . and SLm, except the word line WL2 and the source line SL2, are connected to the ground GND. The remaining bit lines BL1, BL2, . . . and BLn, except the bit line BL3, are floated. Under such a bias voltage condition, the selected unit cell 100A is programmed according to the same mechanism as described above with reference to FIG. 6.

In the case of the unselected unit cell 100B, although the positive program voltage +Vpp and the positive source voltage +Vsp are respectively applied through the word line WL2 and the source line SL2 which are shared with the selected unit cell 100A, the bit line BL2 which is connected to the unit cell 100B is floated. As the bit line BL2 is floated, the unit cell 100B is not programmed. Thus, the unselected unit cell 100B causes substantially no disturbance to the programming operation. Likewise, no unit cells which share the word line WL2 and the source line SL2 with the selected unit cell 100A cause disturbance or interference. In the case of the unselected unit cell 100C, although the bit line BL3 which is shared with the selected unit cell 100A is connected to the ground GND, the word line WL3 and the source line SL3 are also connected to the ground GND. Therefore, the unit cell 100C is not programmed and thus causes substantially no disturbance. Likewise, no unit cell which shares the bit line BL3 with the selected unit cell 100A causes disturbance or interference. In the case of unit cells connected to the remaining word lines, source lines and bit lines, other than the word line WL2, source line SL2 and bit line BL3 connected to the selected unit cell 100A, the word lines and source lines are all connected to the ground GND and the bit lines are floated. Thus, a program operation is not performed.

Erasure operation for the cell array may be performed by applying the negative erasure voltage −Vee to all the word lines WL1, WL2, . . . and WLm, applying the positive source voltage +Vse to all the source lines SL1, SL2, . . . and SLm, and connecting all the bit lines BL1, BL2, . . . and BLn to the ground GND. Under such a bias voltage condition, all the unit cells constituting the cell array are collectively erased. An erasure mechanism is the same as described above with reference to FIG. 6.

In order to read the selected unit cell 100A, the positive read voltage +Vread and the positive drain voltage +Vdr are respectively applied to the word line WL2 and the bit line BL3 which are connected to the selected unit cell 100A. The source line SL2 is connected to the ground GND. The remaining word lines WL1, WL3, ... and WLm and bit lines BL1, BL2, ... and BLn, except the word line WL2 and the bit line BL3, are connected to the ground GND. The remaining source lines SL1, SL3, ... and SLm are also connected to the ground GND in the same manner as the source line SL2. Under such a bias voltage condition, the selected unit cell 100A is read according to the same mechanism as described above with reference to FIG. 6.

In the case of the unselected unit cell 100B, although the positive read voltage +Vread is applied through the word line WL2, which is shared with the selected unit cell 100A, and the source line SL2, which is shared with the selected unit cell 100A, is connected to the ground GND and the bit line BL2, which is connected to the unit cell 100B is connected to the ground GND. As the bit line BL2 is connected to the ground GND, the unit cell 100B is not read, and disturbance does not occur. Likewise, the remaining unit cells, which share the word line WL2 and the source line SL2 with the selected unit cell 100A, are not read and disturbance does not occur. In the case of the unselected unit cell 100C, although the positive drain voltage +Vdr is applied to the bit line BL3, which is shared with the selected unit cell 100A, since the word line WL3 and the source line SL3 which are connected to the unit cell 100C are connected to the ground GND, the unit cell 110C is not read, and disturbance does not occur. Likewise, the remaining unit cells which share the bit line BL3 with the selected unit cell 100A are not read and disturbance does not occur. In the case of unit cells connected to the word lines, source lines or bit lines, other than the word line WL2, source line SL2 and bit line BL3 connected to the selected unit cell 100A, since the word lines, source lines and bit lines are all connected to the ground GND, the read operation is not performed.

Figure 9:
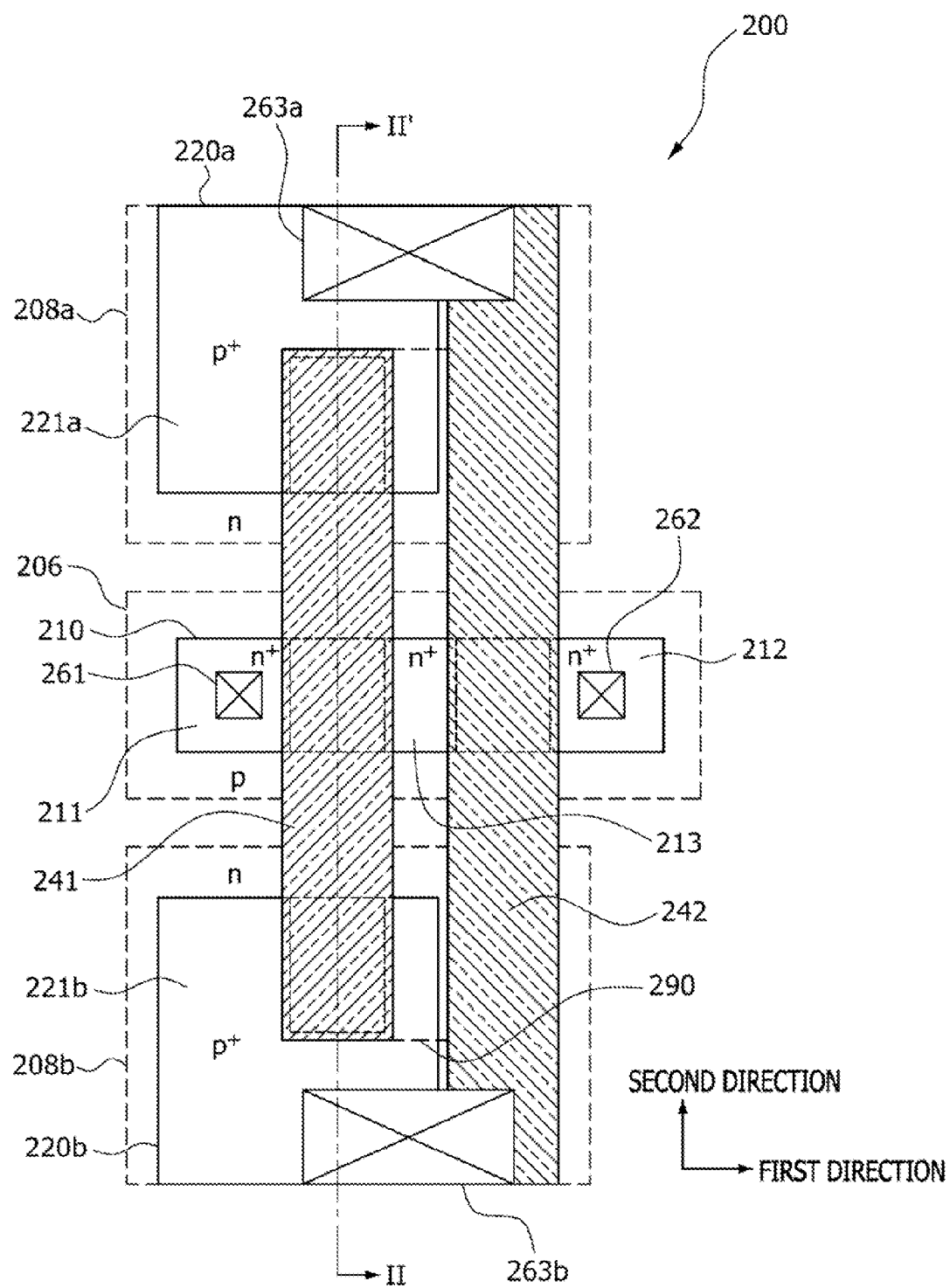
FIG. 9 is a layout diagram showing a unit cell of a nonvolatile memory device in accordance with an embodiment.

FIG. 9 is a layout diagram showing a unit cell of a nonvolatile memory device in accordance with an embodiment. In this embodiment, a unit cell 200 of a nonvolatile memory device includes a storage transistor and a selection transistor with an n channel type MOS structure. Referring to FIG. 9, the unit cell 200 of the nonvolatile memory device has a first active region 210 extending in a first direction. Although not shown in the drawing, the first active region 210 may be defined by an isolation layer. The first active region 210 is disposed in a first well region 206. The first well region 206 has p type conductivity. A first gate 241 is disposed in the form of a stripe which extends in a direction crossing the first active region 210, that is, in a second direction. A second gate 242 is disposed also in the form of a stripe which extends in the direction crossing the first active region 210, that is, in the second direction. The first gate 241 constitutes a floating gate of a charge storage transistor, and the second gate 242 constitutes a selection gate of a selection transistor. Although not shown in the drawing, a first insulation layer may be disposed under the first gate 241, and a second insulation layer may be disposed under the second gate 242. The length of the second gate 242 in the second direction may be longer than the length of the first gate 241 in the second direction. The first gate 241 and the second gate 242 may be constituted by a conductive material layer, for example, a polysilicon layer or a metal layer. The first gate 241 and the second gate 242 are disposed to be separated from each other in the first direction. As shown by the dotted line in the drawing, a dielectric layer 290 may be disposed between the first gate 241 and the second gate 242. The first gate 241, the dielectric layer 290 and the second gate 242 may constitute a first capacitor in a horizontal direction.

A first junction region 211, a second junction region 212 and a third junction region 213 are disposed in the first active region 210 to be separated from one another. The first junction region 211 and the second junction region 212 are respectively disposed at opposite ends of the first active region 210 in the first direction, and are respectively located adjacent to a sidewall of the first gate 241 and a sidewall of the second gate 242. The third junction region 213 is disposed between the first junction region 211 and the second junction region 212 to be separated from the first junction region 211 and the second junction region 212. The third junction region 213 is located between the first gate 241 and the second gate 242. The first junction region 211, the second junction region 212 and the third junction region 213 each have n+ type conductivity. In an embodiment, the first junction region 211 may serve as a source region, and the second junction region 212 may serve as a drain region. The first well region 206, which overlaps with the first gate 241 between the first junction region 211 and the third junction region 213, serves as a first channel region. The first well region 206, which overlaps with the second gate 242 between the second junction region 212 and the third junction region 213, serves as a second channel region.

The unit cell 200 of the nonvolatile memory device further has a second well region 208a which is disposed at a first side of the first well region 206 and separated from the first well region 206 by a predetermined gap when shown from a cross sectional view taken along the second direction. In addition, a third well region 208b is disposed at a second side of the first well region 206 which is opposite to the first side. The third well region 208b is separated from the first well region 206 by a predetermined gap when shown from a cross sectional view taken along the second direction. The second well region 208a and the third well region 208b have n type conductivity. The second well region 208a and the third well region 208b may be disposed symmetrical to each other with respect to the first well region 206. A second active region 220a which is defined by the isolation layer (204 in FIG. 10) is disposed in the second well region 208a. A third active region 220b which is defined by the isolation layer is disposed in the third well region 208b. The second active region 220a overlaps with a first end of the first gate 241. The third active region 220b overlaps with a second end of the first gate 241. The second end of the first gate 241 is located opposite to the first end of the first gate 241 when shown from the cross sectional view taken along the second direction.

A first contact region 221a and a second contact region 221b are respectively disposed in the second active region 220a and the third active region 220b. The first contact region 221a and the second contact region 221b each have p+ type conductivity. The first contact region 221a and the second contact region 221b may be formed by implanting impurity ions into the second well region 208a and the third well region 208b through using the first gate 241 as an ion implantation mask. The first contact region 221a and the second contact region 221b may, respectively, extend under edges of the first gate 241. Further, in the second active region 220a, the second well region 208a overlaps with a portion of the first gate 241. The second well region 208a, which overlaps with the first gate 241, the first insulation layer and the first gate 241 are arranged in a vertical direction and may constitute a second capacitor (also referred to as a vertical capacitor). Similarly, in the third active region 220b, the third well region 208b overlaps with a portion of the first gate 241. The third well region 208b, which overlaps with the first gate 241, the first insulation layer and the first gate 241 are arranged in a horizontal direction and may constitute a third capacitor (also referred to as a horizontal capacitor).

A first contact 261 is disposed on the first junction region 211. The first contact 261 may be electrically, magnetically, electromagnetically, optically, or electrooptically coupled with a line for applying a bias to the first junction region 211. A second contact 262 is disposed on the second junction region 212. The second contact 262 may be electrically magnetically, electromagnetically, optically, or electrooptically coupled with a line for applying a bias to the second junction region 212. A third contact 263a is disposed on the first contact region 221a and extends over the second gate 242. The third contact 263a may be electrically, magnetically, electromagnetically, optically, or electrooptically coupled with a line for applying a bias to the second gate 242 and the first contact region 221a. A fourth contact 263b is disposed on the second contact region 221b and extends over the second gate 242. The fourth contact 263b may be electrically, magnetically, electromagnetically, optically, or electrooptically coupled with a line for applying a bias to the second gate 242 and the second contact region 221b. As the first contact region 221a and the second gate 142 share the one third contact 263a, the bias applied through the third contact 263a may be transmitted to the first contact region 221a and the second gate 142 in substantially the same manner. Similarly, as the second contact region 221b and the second gate 242 share the fourth contact 263b, the bias applied through the fourth contact 263b may be transmitted to the second contact region 221b and the second gate 242 in substantially the same manner. The third contact 263a and the fourth contact 263b may be connected to a common bias voltage line, for example, a word line.

Figure 10:
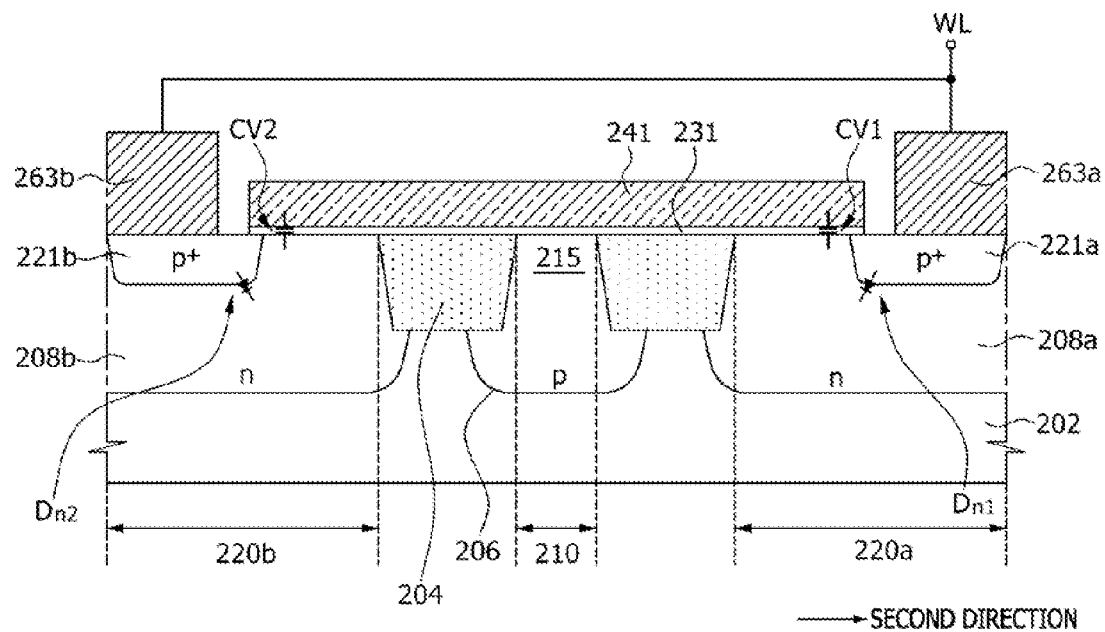
FIG. 10 is a cross-sectional view taken along the line II-II' of FIG. 9.

FIG. 10 is a cross-sectional view taken along the line II-II' of FIG. 9. Referring to FIG. 10 along with FIG. 9, the first active region 210, the second active region 220a and the third active region 220b are defined in a substrate 202 by an isolation layer 204. In the substrate 202, the first active region 210 is disposed in the p type first well region 206, the second active region 220a is disposed in the n type second well region 208a, and the third active region 220b is disposed in the n type third well region 208b. The p+ type first contact region 221a is disposed in an upper portion of the second well region 208a. The p+ type first contact region 221a and the n type second well region 208a may constitute a first pn diode Dn1. The p+ type second contact region 221b is disposed in an upper portion of the third well region 208b. The p+ type second contact region 221b and the n type third well region 208b may constitute a second pn diode Dn2.

A first insulation layer 231 and the first gate 241 each extend in the second direction. A first channel region 215 is disposed in a region where the first active region 210 and the first gate 241 overlap with each other. The third contact 263a is disposed on the first contact region 221a, and the fourth contact 263b is disposed on the second contact region 221b. The third contact 263a and the fourth contact 263b may be commonly connected to a word line WL. The second capacitor CV1 is formed in a region where the first gate 241, the first insulation layer 231 and the second well region 208a overlap with one another. The third capacitor CV2 is formed in a region where the first gate 241, the first insulation layer 231 and the third well region 208b overlap with one another.

Figure 11:
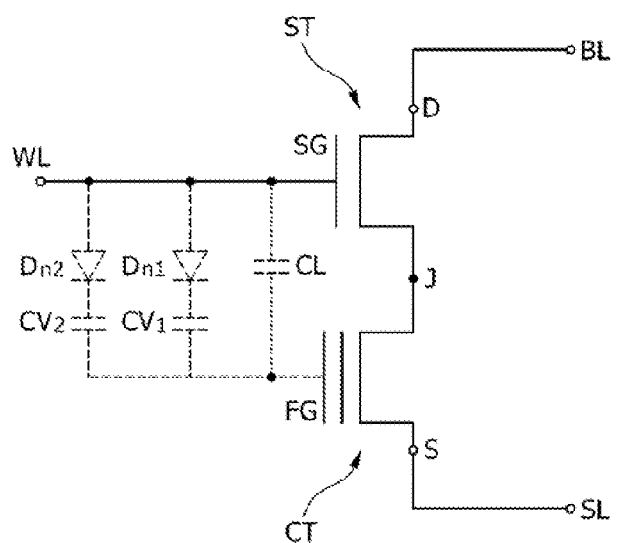
FIG. 11 is an equivalent circuit diagram of the unit cell of the nonvolatile memory device shown in FIGS. 9 and 10.

FIG. 11 is an equivalent circuit diagram of the unit cell of the nonvolatile memory device shown in FIGS. 9 and 10.

Referring to FIG. 11 along with FIGS. 9 and 10, the unit cell 200 of the nonvolatile memory device has the single-layered gate. In the equivalent circuit, a storage transistor CT and a selection transistor ST are connected in series. The storage transistor CT may be constituted by the first gate 241, the first junction region 211 and the third junction region 213. The selection transistor ST may be constituted by the second gate 242, the second junction region 212 and the third junction region 213. The storage transistor CT and the selection transistor ST share the third junction region 213. In the equivalent circuit diagram of FIG. 11, the storage transistor CT has a floating gate terminal FG, a source terminal S and a junction terminal J. The floating gate terminal FG of the storage transistor CT corresponds to the first gate 241 of FIGS. 9 and 10. The source terminal S and the junction terminal J of the storage transistor CT respectively correspond to the first junction region 211 and the third junction region 213 of FIG. 9. The source terminal S of the storage transistor CT is connected to a source line SL. The selection transistor ST has a selection gate terminal SG, a drain terminal D and a junction terminal 3. The selection gate terminal SG of the selection transistor ST corresponds to the second gate 242 of FIG. 9 and is connected to the word line WL. The drain terminal D and the junction terminal J of the selection transistor ST respectively correspond to the second junction region 212 and third junction region 213 of FIG. 9. The drain terminal D of the selection transistor ST is connected to a bit line BL.

As described above with reference to FIG. 9, the first gate 241, the dielectric layer 290 and the second gate 242 constitute the first capacitor CL. In the equivalent circuit diagram of FIG. 11, both terminals of the first capacitor CL are connected to the selection gate terminal SG of the selection transistor ST and the floating gate terminal FG of the storage transistor CT, respectively. As described above with reference to FIG. 10, the first gate 241, the first insulation layer 231 and the second well region 208a constitute the second capacitor CV1. Further, the first contact region 221a and the second well region 208a constitute the first pn diode Dn1. According to these facts, in the equivalent circuit diagram of FIG. 11, one terminal of the second capacitor CV1 is connected to the floating gate terminal FG of the storage transistor CT, and the other terminal of the second capacitor CV1 is connected to the cathode of the first pn diode Dn1. The anode of the first pn diode Dn1 is commonly connected to the selection gate terminal SG of the selection transistor ST and the word line WL. Similarly, the first gate 241, the first insulation layer 231 and the third well region 208b collectively constitute the third capacitor CV2. Further, the second contact region 221b and the third well region 208b constitute the second pn diode Dn2. According to these facts, in the equivalent circuit diagram of FIG. 11, one terminal of the third capacitor CV2 is connected to the floating gate terminal FG of the storage transistor CT, and the other terminal of the third capacitor CV2 is connected to the cathode of the second pn diode Dn2. The anode of the second pn diode Dn2 is commonly connected to the selection gate terminal SG of the selection transistor ST and the word line WL.

The first capacitor CL, the second capacitor CV1 and the third capacitor CV2 are connected in parallel. The bias voltage applied to the word line WL is transferred to the floating gate terminal FG of the storage transistor CT through the first capacitor CL. Moreover, the bias voltage applied to the word line WL is transferred to the floating gate terminal FG of the storage transistor CT through the second capacitor CV1 and the third capacitor CV2, as well. In this way, in the unit cell 200 of the nonvolatile memory device according to this embodiment, the bias voltage applied to the word line WL induces first, second, and third coupling voltages to the floating gate terminal FG of the storage transistor CT through the first capacitor CL, the second capacitor CV1 and the third capacitor CV2, respectively. Thus, coupling efficiency with respect to the floating gate terminal FG may be increased. In particular, in the second capacitor CV1 and the third capacitor CV2, the first insulation layer 231 has a sufficiently thin thickness, for example, a thickness of approximately 80 Å. Thus, it is possible to induce a substantially high coupling ratio, compared to when solely the first capacitor CL, which has a relatively thick dielectric layer 290, is employed. The dielectric layer 290 may have, for example, a thickness of approximately 1,000 Å.

Figure 12:
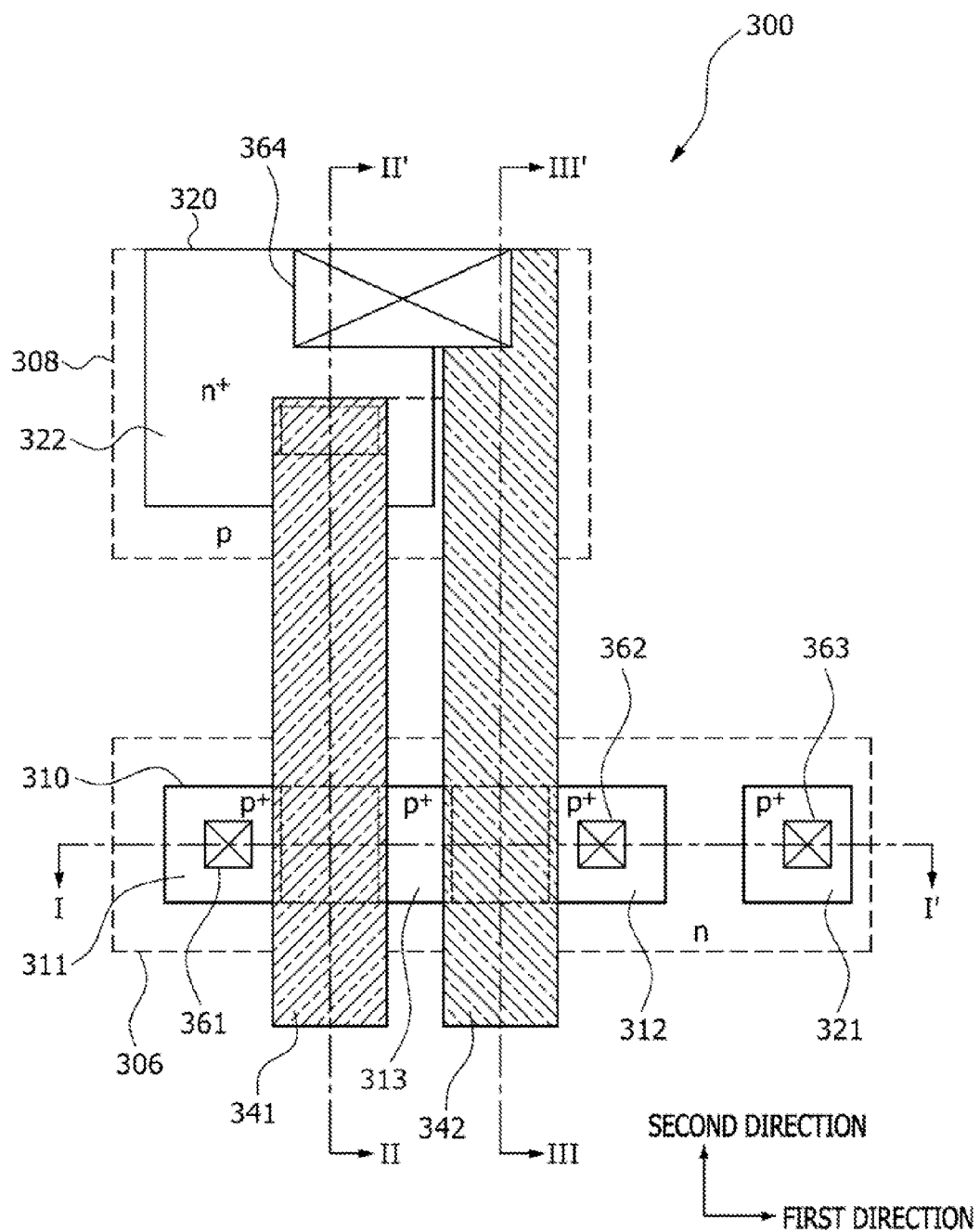
FIG. 12 is a layout diagram showing a unit cell of a nonvolatile memory device in accordance with an embodiment.

FIG. 12 is a layout diagram showing a unit cell of a nonvolatile memory device in accordance with an embodiment. In this embodiment, a storage transistor and a selection transistor which constitute a unit cell 300 of a nonvolatile memory device are configured as a p channel type MOS structure. As the storage transistor and the selection transistor are configured as the p channel type MOS structure, the magnitude of a bias necessary for programming may be decreased compared to when the storage transistor and the selection transistor are configured as an n channel type MOS structure. Accordingly, the size of the pumping circuit for applying the bias voltage may be reduced. Referring to FIG. 12, the unit cell 300 according to this embodiment has a first active region 310 extending in a first direction (the transverse direction in the drawing). Although not shown in the drawing, the first active region 310 may be defined by an isolation layer. The first active region 310 is surrounded by a first well region 306. The first well region 306 has n type conductivity. A first junction region 311, a second junction region 312 and a third junction region 313 are disposed in the first active region 310 to be separated from one another. The first junction region 311 and the second junction region 312 are respectively disposed at first and second ends of the first active region 310 in the first direction, and the third junction region 313 is disposed between the first junction region 311 and the second junction region 312. The first junction region 311, the second junction region 312 and the third junction region 313 each have p+ type conductivity. In an embodiment, the first junction region 311 may serve as a drain region, and the second junction region 312 may serve as a source region. A first contact region 321 is disposed in the first well region 306 to be separated from the first active region 310 by a predetermined gap. The first contact region 321, as a contact region for applying a bias voltage to the first well region 306, has p+ type conductivity.

A first gate 341 is disposed in the form of a stripe which extends in a direction crossing the first active region 310, that is, a second direction. A second gate 342 is disposed also in the form of a stripe which extends in the direction crossing the first active region 310, that is, the second direction. The length of the second gate 342 when measured in the second direction may be longer than the length of the first gate 341 when measured in the second direction. The first gate 341 and the second gate 342 may include a conductive material layer, for example, a polysilicon layer or a metal layer. The first gate 341 and the second gate 342 are disposed to be separated from each other in the first direction. Although not shown in the drawing, a dielectric layer may be disposed between the first gate 341 and the second gate 342, and according to this fact, a horizontal type first capacitor which is constituted by the first gate 341, the dielectric layer and the second gate 342 may be configured.

The first junction region 311 is formed adjacent to a sidewall of the first gate 341, the second junction region 312 is formed adjacent to a sidewall of the second gate 342, and the third junction region 313 is formed between the first gate 341 and the second gate 342. Thus, the first well region 306 is formed between the first junction region 311 and the third junction region 313. An area where the first gate 341 overlap in the first active region 310 forms a first channel region 315. The second gate 342 is formed between the second junction region 312 and the third junction region 313. An area where the second gate 342 overlap in the first active region 310 forms a second channel region 316. In an embodiment, the first gate 341 may constitute a floating gate of a charge storage transistor, and the second gate 342 may constitute a selection gate of a selection transistor. Although not shown in the drawing, a first insulation layer may be disposed under the first gate 341, and a second insulation layer may be disposed under the second gate 342.

The unit cell 300 of the nonvolatile memory device according to this embodiment further has a second active region 320. The second active region 320 overlaps with a portion of the first gate 341 in the second direction. The second active region 320 may be defined by the isolation layer, and is separated from the first active region 310 by a predetermined gap. While the second active region 320 may have a quadrangular planar structure in FIG. 12, the second active region 320 may have various planar structures other than the quadrangular planar structure, in another example. The second active region 320 is surrounded by a second well region 308. The second well region 308 has p type conductivity. A second contact region 322 is disposed in the second active region 320. An end of the first gate 341 may be placed within the second active region 320. The second contact region 322 may be formed by implanting impurity ions into the second well region 308 through using the first gate 341 as an ion implantation mask. In this case, the second contact region 322 may extend under edges of the first gate 341. The second contact region 322 has n+ type conductivity. The second well region 308, the first insulation layer and the first gate 341 may constitute a vertical type second capacitor.

A first contact 361 is disposed in the first junction region 311. The first contact 361 may be electrically, magnetically, electromagnetically, optically, or electro-optically coupled with a line for applying a bias to the first junction region 311. A second contact 362 is disposed in the second junction region 312. The second contact 362 may be electrically magnetically, electromagnetically, optically, or electro-optically coupled with a line for applying a bias to the second junction region 312. A third contact 363 is disposed in the first contact region 321. The third contact 363 may be electrically, magnetically, electromagnetically, optically, or electro-optically coupled with a line for applying a bias to the first well region 306. A fourth contact 364 is disposed in the second contact region 322 and extends over the second gate 342. The fourth contact 364 may be electrically, magnetically, electromagnetically, optically, or electro-optically coupled with a line for applying a bias to the second gate 342 and the second contact region 322. As the second contact region 322 and the second gate 342 share the fourth contact 364, the bias applied through the fourth contact 364 may be applied to the second contact region 322 and the second gate 342 in substantially the same manner.

Figure 13:
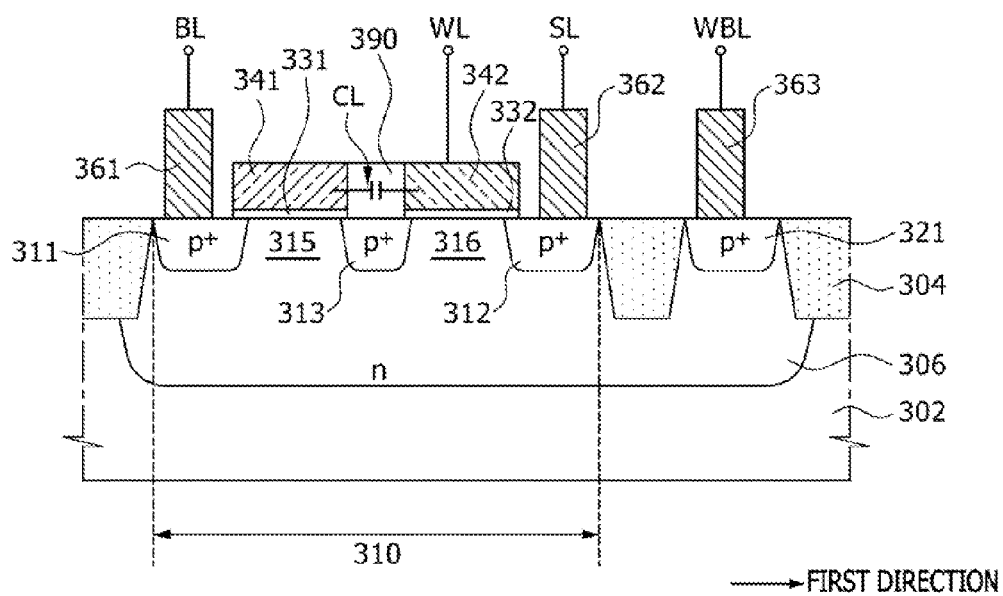
FIG. 13 is a cross-sectional view taken along the line I-I' of FIG. 12.
Figure 14:
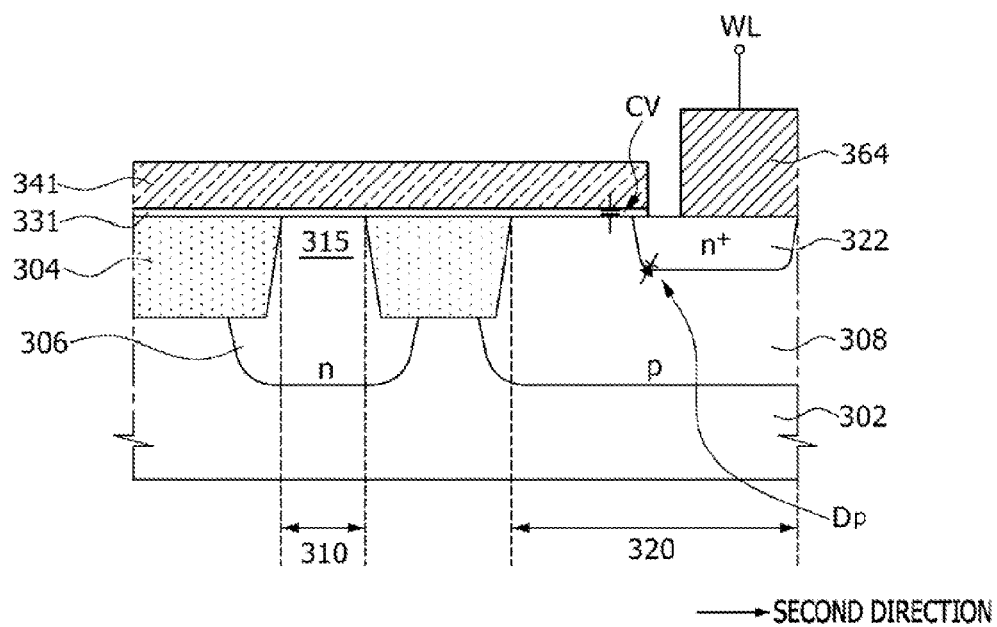
FIG. 14 is a cross-sectional view taken along the line II-II' of FIG. 12.
Figure 15:
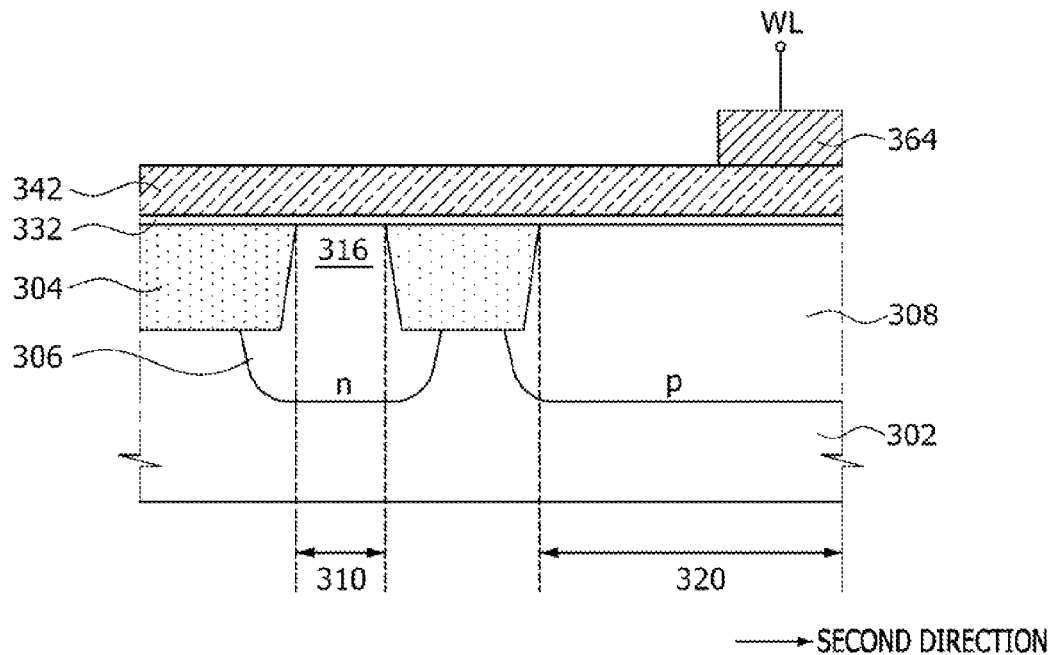
FIG. 15 is a cross-sectional view taken along the line III-III' of FIG. 12.

FIGS. 13 to 15 are cross-sectional views respectively taken along the lines I-I', II-II' and III-III' of FIG. 12. First, referring to FIG. 13 along with FIG. 12, an isolation layer 304 is disposed in a substrate 302. The first active region 310 is defined by the isolation layer 304 in the first direction. The n type first well region 306 is disposed in the substrate 302. The first well region 306 is disposed to surround the first active region 310. In the first active region 310, the p+ type first junction region 311, the p+ type second junction region 312 and the p+ type third junction region 313 are disposed to be separated from one another. The first junction region 311 and the second junction region 312 are respectively disposed in opposite portions (e.g., in opposite ends) of the first active region 310, and the third junction region 313 is disposed between the first junction region 311 and the second junction region 312. An upper portion of the first well region 306 between the first junction region 311 and the third junction region 313 may serve as a first channel region 315. An upper portion of the first well region 306 between the second junction region 312 and the third junction region 313 may serve as a second channel region 316. The p+ type first contact region 321 is disposed in the first well region 306 to be separated from the first active region 310.

A first insulation layer 331 and the first gate 341 are disposed on the first channel region 315. A second insulation layer 332 and the second gate 342 are disposed on the second channel region 316. A dielectric layer 390 is disposed between the first gate 341 and the second gate 342. Thus, a first capacitor CL is obtained which includes the first gate 341, the dielectric layer 390 and the second gate 342. The first gate 341 may be a floating state, and the second gate 342 may be connected to a word line WL. The first junction region 311 may be connected to a bit line BL through the first contact 361, and the second junction region 312 may be connected to a source line SL through the second contact 362. The first contact region 321 may be connected to a well bias line WBL through the third contact 363.

Next, referring to FIGS. 14 and 15 along with FIG. 12, the first active region 310 and the second active region 320 are defined in the substrate 302 by the isolation layer 304 in the second direction. In the substrate 302, the first active region 310 is surrounded by the first well region 306, and the second active region 320 is surrounded by the second well region 308. The second well region 308 has p type conductivity. As shown in FIG. 14, the second contact region 322 is disposed in an upper portion of the second well region 308. The second contact region 322 has n type conductivity. The first insulation layer 331 and the first gate 341 each extend in the second direction. The first channel region 315 is disposed in a region where the first active region 310 and the first gate 341 overlap with each other. The fourth contact 364 is disposed in the second contact region 322. The fourth contact 364 may be connected to the word line WL. The first gate 341, the first insulation layer 331 and the second well region 308 may constitute a vertical type second capacitor CV. As shown in FIG. 15, the second insulation layer 332 and the second gate 342 each extend in the second direction. The fourth contact 364 is disposed on the end of the second gate 342, and accordingly, the second gate 342 may be connected to the word line WL through the fourth contact 364.

Figure 16:
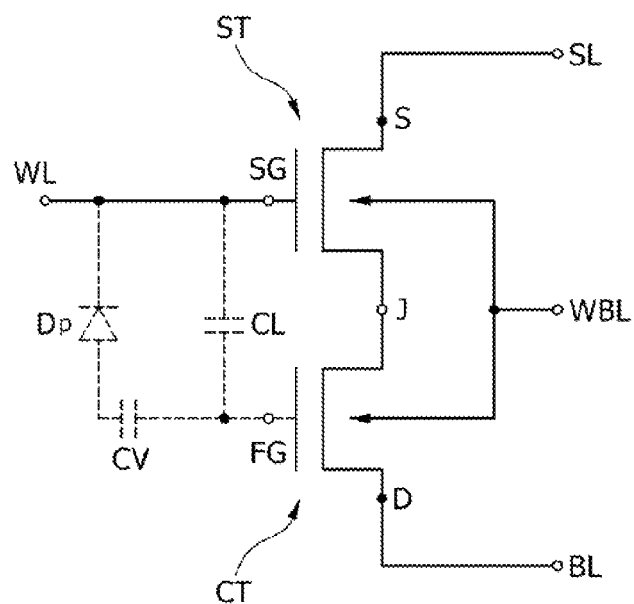
FIG. 16 is an equivalent circuit diagram of a unit cell of the nonvolatile memory device shown in FIGS. 12 to 15.

FIG. 16 is an equivalent circuit diagram of the unit cell of the nonvolatile memory device shown in FIGS. 12 to 15. Referring to FIG. 16 along with FIGS. 12 to 15, the unit cell 300 of the nonvolatile memory device includes an equivalent circuit in which a storage transistor CT and a selection transistor ST are connected in series. The storage transistor CT may include the first gate 341, the first junction region 311 and the third junction region 313. The selection transistor ST may include the second gate 342, the second junction region 312 and the third junction region 313. The storage transistor CT and the selection transistor ST share the third junction region 313, and each form the p channel type MOS structure.

In the equivalent circuit diagram of FIG. 16, the storage transistor CT has a floating gate terminal FG, a drain terminal D and a junction terminal J. The floating gate terminal FG of the storage transistor CT corresponds to the first gate 341 of FIGS. 12 to 14. The drain terminal D and the junction terminal J of the storage transistor CT respectively correspond to the first junction region 311 and the third junction region 313 of FIGS. 12 and 13. The drain terminal D of the storage transistor CT is connected to the bit line BL. The selection transistor ST has a selection gate terminal SG, a source terminal S and a junction terminal J. The selection gate terminal SG of the selection transistor ST corresponds to the second gate 342 of FIGS. 12 and 15 and is connected to the word line WL. The source terminal S and the junction terminal J of the selection transistor ST respectively correspond to the second junction region 312 and the third junction region 313 of FIGS. 12 and 13. The source terminal S of the selection transistor ST is connected to the source line SL. The first well region 306 is connected to the well bias line WBL through the first contact region 321 and the third contact 363.

As described above with reference to FIG. 13, the first gate 341, the dielectric layer 390 and the second gate 342 constitute the first capacitor CL. In the equivalent circuit diagram of FIG. 16, two terminals of the first capacitor CL are connected between the selection gate terminal SG of the selection transistor ST and the floating gate terminal FG of the storage transistor CT. As described above with reference to FIG. 14, the first gate 341, the first insulation layer 331 and the second well region 308 constitute the second capacitor CV. Further, the second well region 308 and the second contact region 322 constitute a pn diode Dp. In the equivalent circuit diagram of FIG. 16, a first terminal of the second capacitor CV is connected to the floating gate terminal FG of the storage transistor CT, and a second terminal of the second capacitor CV is connected to the anode of the pn diode Dp. The cathode of the pn diode Dp is commonly connected to the selection gate terminal SG of the selection transistor ST and the word line WL. The first capacitor CL and the second capacitor CV are connected in parallel. The bias voltage applied to the word line WL is transferred to the floating gate terminal FG of the storage transistor CT through the first capacitor CL. Moreover, the bias voltage applied to the word line WL is transferred to the floating gate terminal FG of the storage transistor CT through the second capacitor CV as well.

FIG. 17 is a table explaining the operations of the unit cell of the nonvolatile memory device shown in FIGS. 12 to 15. Referring to FIG. 17, the program operation of the unit cell 300 of the nonvolatile memory device may be performed in a hot electron injection scheme, and the erase operation of the unit cell 300 of the nonvolatile memory device may be performed in a Fowler-Nordheim tunneling scheme. As the erasure operation is performed in the Fowler-Nordheim tunneling scheme, unwanted hole trap is prevented from being created in the first insulation layer 331 (see FIG. 13) which is used as a tunneling layer, and accordingly, retention and cycling characteristics may be improved.

In detail, in order to program the unit cell 300 of the nonvolatile memory device which has the single-layered gate, a positive program voltage +Vpp is applied to the word line WL, and a positive source voltage +Vsp is applied to the source line SL. Further, the bit line BL is connected to the ground GND, and a well bias voltage +Vwp is applied to the well bias line WBL. In an example, the program voltage +Vpp may be approximately 2V to approximately 4V, for example, approximately 3V. In an example, the source voltage +Vsp may be approximately 5V to approximately 7V, for example, approximately 6V. In an example, the well bias voltage +Vwp may be approximately 5V to approximately 7V, for example, approximately 6V.

Since the fourth contact 364, which is connected to the word line WL, contacts the second gate 342 as shown in FIG. 15, the program voltage +Vpp applied to the word line WL is applied to the second gate 342 through the fourth contact 364. As the program voltage +Vpp is applied to the second gate 342, a first coupling voltage, which is horizontally coupled to the program voltage +Vpp, is induced in the first gate 341 through the first capacitor CL. When the program operation to the unit cell is performed, a reverse bias is applied to the pn diode Dp (see FIG. 14). Thus, there is no coupling voltage to be induced by the second capacitor CV.

As the program voltage +Vpp is applied to the second gate 342, an inversion layer is formed in the second channel region 316, and thus a channel is activated. The source voltage +Vsp applied to the second junction region 312 through the source line SL is transferred to the third junction region 313. As the first coupling voltage is induced in the first gate 341 through the first capacitor CL and the source voltage +Vsp is transferred to the third junction region 313, hot electrons are produced around the third junction region 313 under the first gate 341. The hot electrons are injected into the first gate 341 by passing through the first insulation layer 331 using an electric field effect. That is, an electric field is formed by the first coupling voltage induced in the first gate 341 and the well bias voltage +Vwp. By such injection of hot electrons, the storage transistor, including the first junction region 311, the third junction region 313 and the first gate 341, is placed in a programmed state, I.e., in a turned-on state.

In order to erase the unit cell 300 of the nonvolatile memory device, a negative erasure voltage −Vee is applied to the word line WL, and the source line SL and the bit line BL are floated, and a positive well bias voltage +Vwe is applied to the well bias line WBL. In an example, the erasure voltage −Vee may be approximately −5V to approximately −7V, for example, approximately −6V. In an example, the well bias voltage +Vwe may be approximately 5V to approximately 7V, for example, approximately 6V. Since the fourth contact 364, which is connected to the word line WL, contacts the second gate 342 as shown in FIG. 15, the erasure voltage −Vee applied to the word line WL is applied to the second gate 342 through the fourth contact 364.

As the erasure voltage −Vee is applied to the second gate 342, a first negative coupling voltage, which is horizontally coupled to the erasure voltage −Vee, is induced in the first gate 341 through the first capacitor CL described above with reference to FIG. 13. Also, the erasure voltage −Vee applied to the second gate 342 is transferred to the second well region 308 through the pn diode Dp described above with reference to FIG. 14. In this embodiment, the voltage drop by the bulk resistance of the pn diode Dp will be neglected. As the erasure voltage −Vee is transferred to the second well region 308, a second negative coupling voltage, which is vertically coupled to the erasure voltage −Vee transferred to the second well region 308, is induced in the first gate 141 through the second capacitor CV. The first negative coupling voltage and the second negative coupling voltage are induced in the first gate 341 through the first capacitor CL and the second capacitor CV. The well bias voltage +Vwe of a predetermined magnitude is applied through the well bias line WBL. Under this situation, the electrons retained in the first gate 341 tunnel to the first well region 306 by passing through the first insulation layer 331. The electrons pass through the electric field formed in the first insulation layer 331 and created by the first and second negative coupling voltages and the well bias voltage +Vwe. Through such tunneling of electrons, the storage transistor, which is constituted by the first junction region 311, the third junction region 313 and the first gate 341, is placed in an erased state, i.e., in a turned-off state.

In order to perform the read operations of the unit cell 300 of the nonvolatile memory device, the word line WL is connected to the ground GND, and a positive source voltage +Vsr is applied to the source line SL. Further, a positive bit line voltage +Vdr is applied to the bit line BL, and a positive well bias voltage +Vwr is applied to the well bias line WBL. In an example, the source voltage +Vsr may be approximately 1.5V to approximately 2.5V, for example, approximately 2.0V. In an example, the bit line voltage +Vdr may be approximately 3V to approximately 3.6V, for example, approximately 3.3V. In an example, the well bias voltage +Vwr may be approximately 3V to approximately 3.6V, for example, approximately 3.3V. In another example, the source voltage +Vsr may be a ground voltage, that is, 0V. In this case, the bit line voltage +Vdr and the well bias voltage +Vwr each may be approximately 1.0V to approximately 1.4V, for example, approximately 1.2V. When electrons are retained in the first gate 341 (for example, the selected cell has a data "1"), the unit cell 300 is in the turned-on state and current flows. Conversely, when electrons in the first gate 341 are not retained in the first gate 341 (for example, the selected cell has a data "o"), the unit cell 300 is in the turned-off state and current does not flow.

Figure 18:
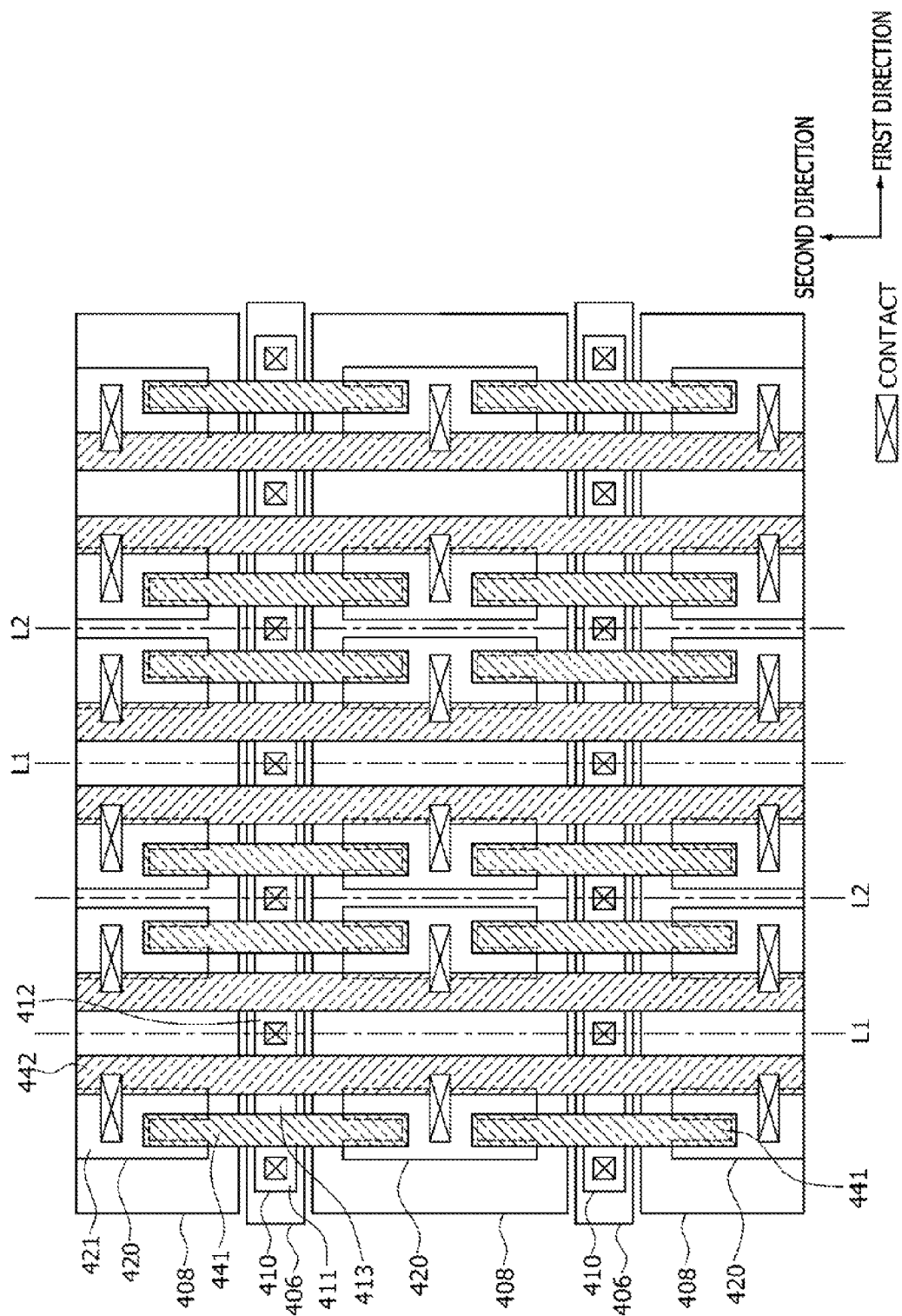
FIG. 18 is a layout diagram showing a cell array of a nonvolatile memory device in accordance with an embodiment.

FIG. 18 is a layout diagram showing a cell array of a nonvolatile memory device in accordance with an embodiment. Referring to FIG. 18, a plurality of p type first well regions 406 are disposed to be separated from one another in a second direction. The respective p type first well regions 406 are disposed in the form of stripes which extend in a first direction. A plurality of n type second well regions 408 are respectively disposed between the p type first well regions 406 in the second direction. The respective n type second well regions 408 are disposed in the form of stripes which extend in the first direction. First active regions 410 are disposed in each of the p type first well regions 406 and extend in the first direction. An n+ type first junction region 411, an n+ type second junction region 412 and an n+ type third junction region 413 are disposed in the first active region 410. A plurality of second active regions 420 are disposed in each of the n type second well regions 408 to be separated from one another in the first direction. A p+ type contact region 421 is disposed in each of the second active regions 420. A plurality of first gates 441 are disposed to be separated from one another in the first direction and the second direction. Each of the first gates 441 has the form of a stripe which extends in the second direction. A plurality of second gates 442 are disposed to be separated from one another in the first direction and each of the second gates 442 has the form of a stripe which extends in the second direction to be parallel to the first gates 441.

The first gate 441 crosses the first active region 410, and has a portion (e.g., an end portion) which overlaps with an n type second well region 408 adjacent to the first active region 410 in the second direction (the upward direction in the drawing). Another portion (e.g., another end portion) of the first gate 441 overlaps with an n type second well region 408 adjacent to the first active region 410 in a direction opposite to the second direction (the downward direction in the drawing). The n+ type first junction region 411, the n+ type second junction region 412 and the n+ type third junction region 413 in the first active region 410 and the p+ type contact region 421 in the second active region 420 may be formed by implanting impurity ions into the p type first well region 406 and the n type second well region 408 by using the first gate 441 and the second gate 442 as ion implantation masks. As a result, the n+ type first junction region 411 and the n+ type third junction region 413 may extend under edges of the first gate 441, and the n+ type second junction region 412 and the n+ type third junction region 413 may extend under edges of the second gate 442. Also, the p+ type contact region 421 may extend under edges (e.g., edges of the end) of the first gate 441, and may further extend under edges of the second gate 442.

In order to improve the degree of integration of the cell array, unit cells which are adjacent to each other in the first direction may be disposed to be symmetrical to each other with respect to a first reference line L1 or a second reference line L2. The first reference line L1 and the second reference line L2, as reference lines which extend in the second direction between the unit cells adjacent to each other in the first direction, are arranged alternately in the first direction. In the cell array according to this embodiment, the second gates 442 of unit cells disposed on both sides of the first reference line L1 in the first direction are disposed adjacent to the first reference line L1. The first gates 441 of unit cells disposed on both sides of the second reference line L2 in the first direction are disposed adjacent to the second reference line L2.

Figure 19:
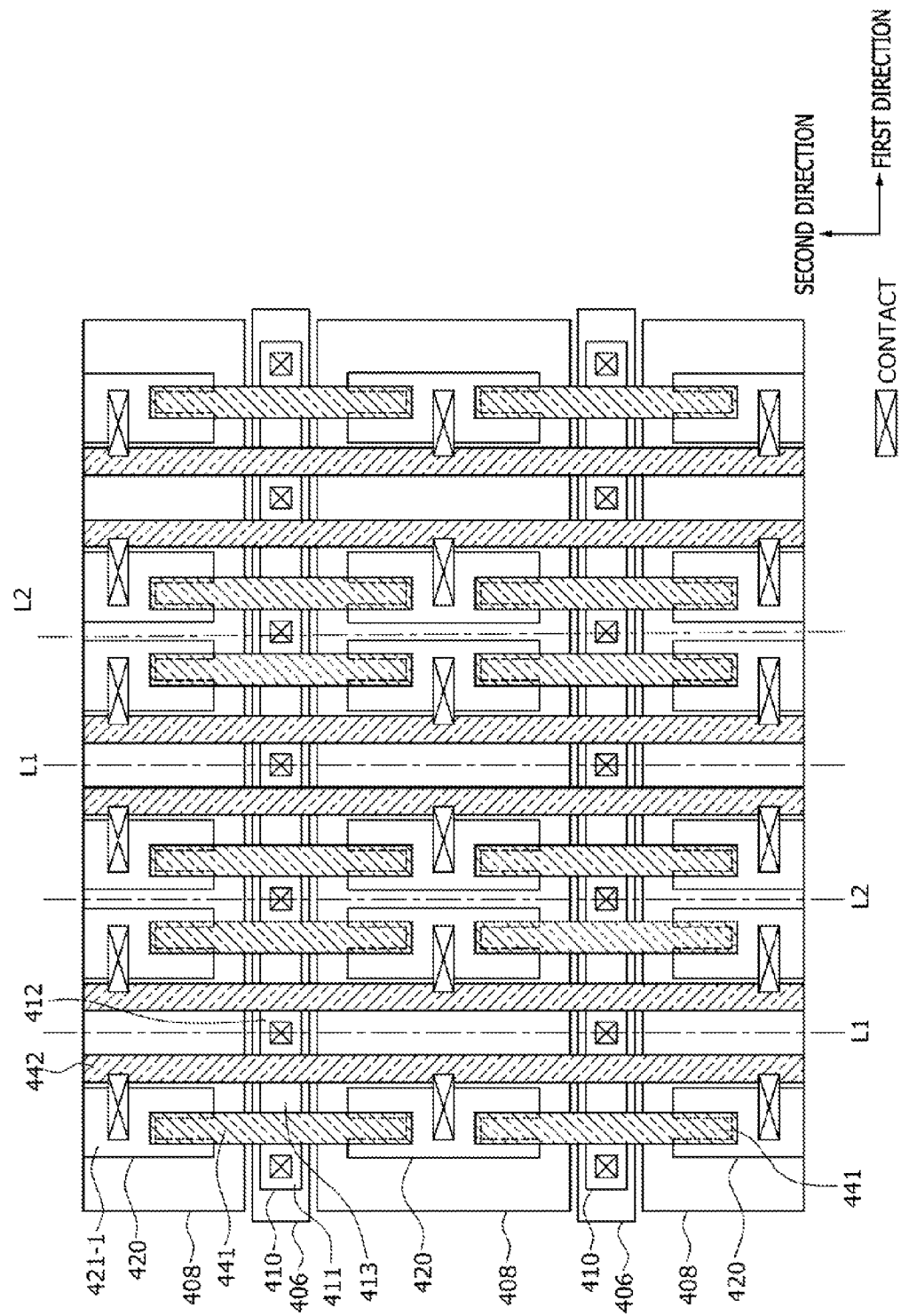
FIG. 19 is a layout diagram showing a cell array of a nonvolatile memory device in accordance with an embodiment.

FIG. 19 is a layout diagram showing a cell array of a nonvolatile memory device in accordance with an embodiment. Since the reference numerals of FIG. 19 which are the same as those of FIG. 18 refer to the same component elements, except a p+ type contact region 421-1, repeated descriptions will be omitted herein. Referring to FIG. 19, in the cell array according to this embodiment, the p+ type contact region 421-1 may extend under edges of the end of the first gate 441 and be separated from the second gate 442 by a predetermined gap.

Figure 20:
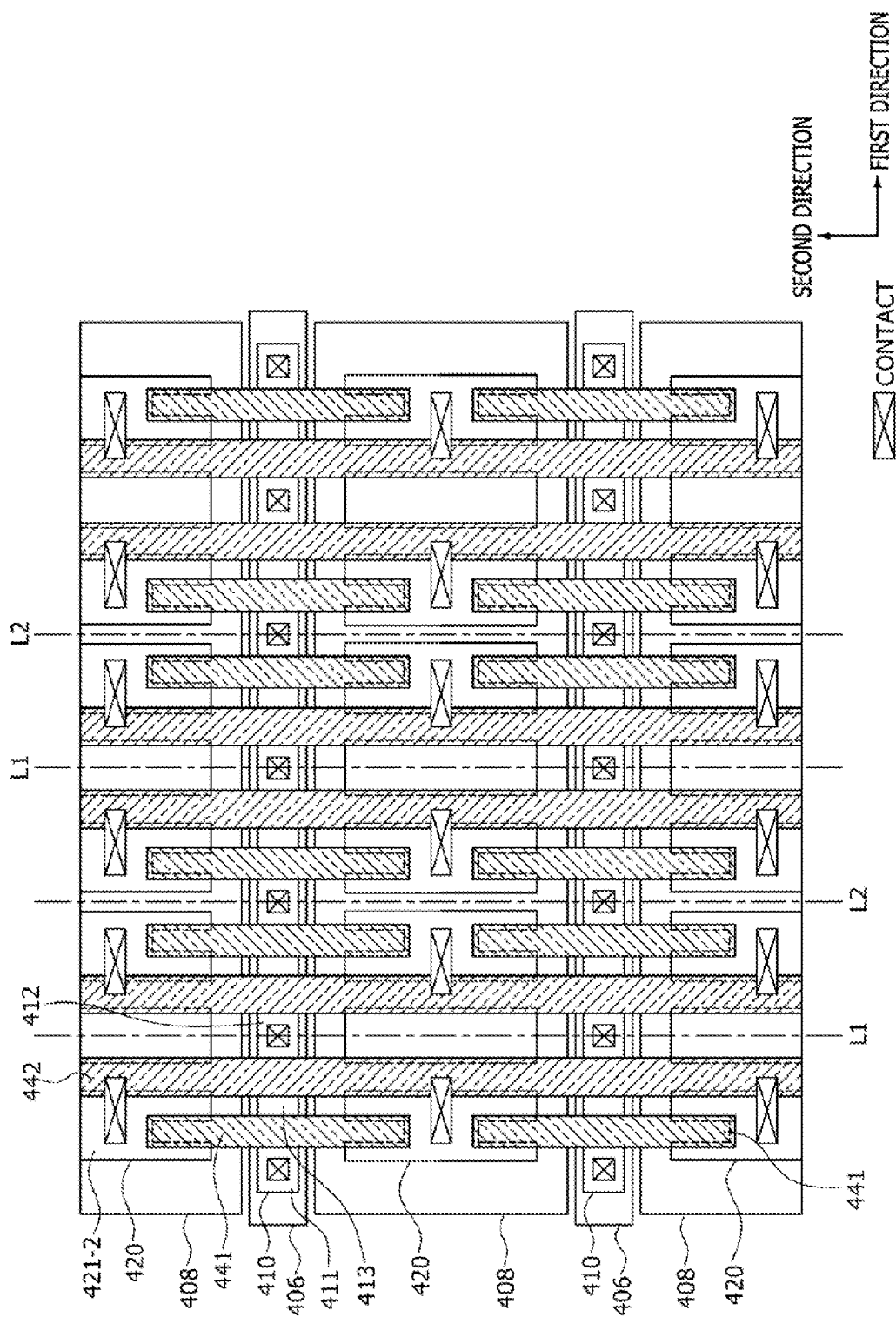
FIG. 20 is a layout diagram showing a cell array of a nonvolatile memory device in accordance with an embodiment.

FIG. 20 is a layout diagram showing a cell array of a nonvolatile memory device in accordance with an embodiment. Since the reference numerals of FIG. 20 which are the same as those of FIG. 18 refer to the same component elements, except a p+ type contact region 421-2, repeated descriptions will be omitted herein. Referring to FIG. 20, in the cell array according to this embodiment, the p+ type contact region 421-2 may extend under edges of the first gates 441 and may further extend under both sidewalls of the second gates 442. Both sidewalls of the second gates 442 are disposed on opposite sides of the first reference line L1 which extends in the first direction.

Figure 21:
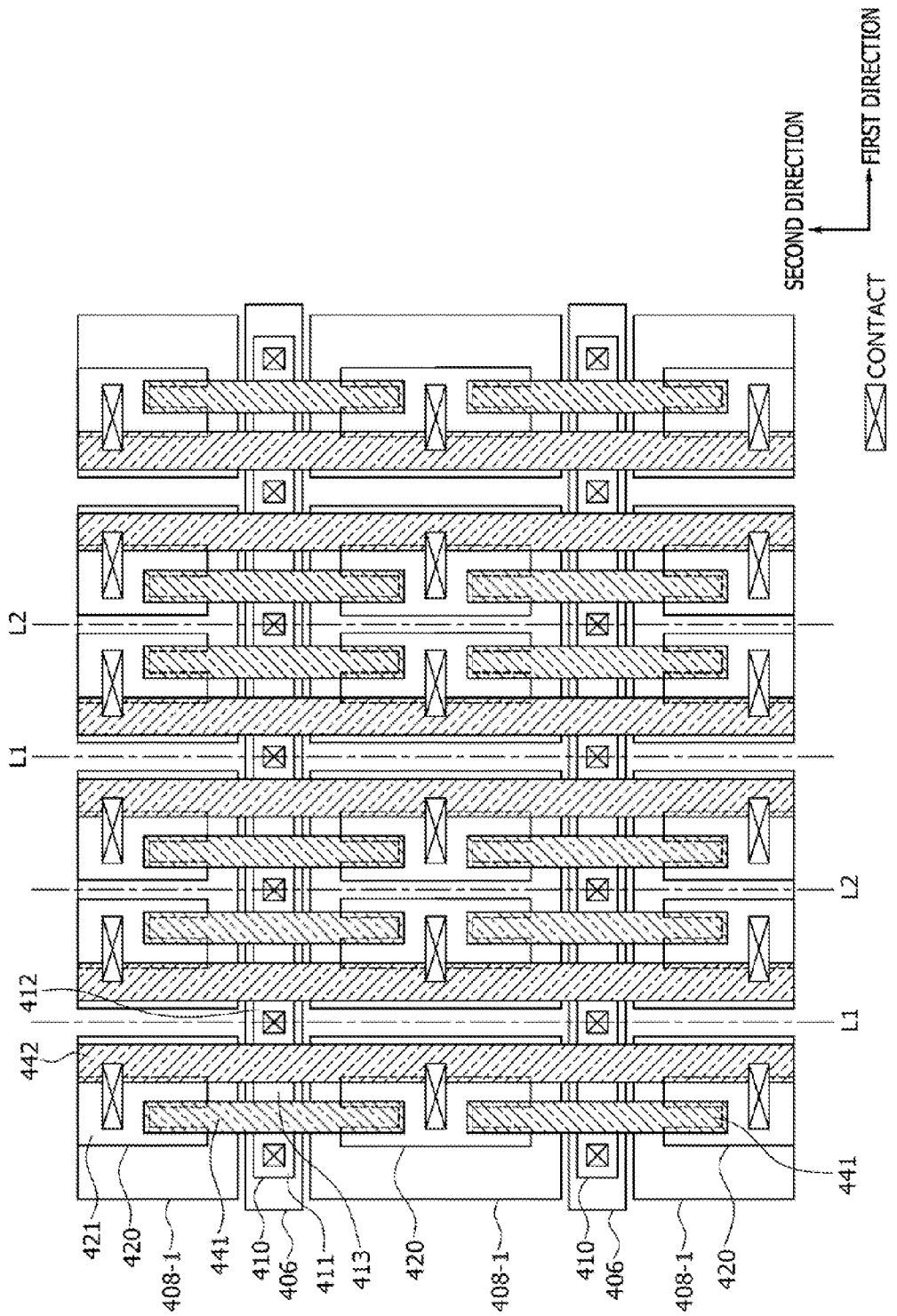
FIG. 21 is a layout diagram showing a cell array of a nonvolatile memory device in accordance with an embodiment.

FIG. 21 is a layout diagram showing a cell array of a nonvolatile memory device in accordance with an embodiment. Since the reference numerals of FIG. 21, which are the same as those of FIG. 18, refer to the same component elements, except a plurality of n type second well regions 408-1, repeated descriptions will be omitted herein. Referring to FIG. 21, in the cell array according to this embodiment, the plurality of n type second well regions 408-1 are disposed to be separated from one another in the first direction and the second direction. In detail, in the first direction, each n type second well region 408-1 is commonly coupled to two unit cells which are separated from each other with respect to the first reference line L1 and are disposed on both sides of the second reference line L2. In the second direction, each n type second well region 408-1 is disposed between p type first well regions 406.

According to an embodiment, the floating gate and the selection gate are not vertically stacked. Rather, they are arranged side by side with respect to a surface of a substrate. That is, either the floating gate or the selection gate can be configured in a single-layered gate structure. Thus, the memory device can be fabricated along with a logic device using a CMOS process.

Various embodiments have been disclosed above for illustrative purposes, and thus should not be construed limiting.

What is claimed is:

1. A nonvolatile memory device comprising:
a first active region and a second active region separated from each other;
a floating gate crossing the first active region, and disposed such that an end thereof overlaps with the second active region;
a selection gate crossing the first active region, disposed side by side, and coupled to the floating gate;
a dielectric layer disposed between the floating gate and the selection gate, wherein a stack of the dielectric layer, the floating gate and the selection gate forms a first capacitor in a horizontal structure;
a well region disposed in the second active region and coupled to the floating gate, wherein a stack of the well region and the floating gate forms a second capacitor in a vertical structure; and
a contact commonly coupled to the well region and the selection gate.

2. The nonvolatile memory device according to claim 1, wherein the first active region extends in a first direction,
wherein the second active region is separated from the first active region in a second direction, and
wherein the second direction is substantially perpendicular to the first direction.

3. The nonvolatile memory device according to claim 2, wherein the floating gate and the selection gate are separated from each other in the first direction and are side by side with each other in the second direction.

4. The nonvolatile memory device according to claim 1, further comprising:
a first junction region, a second junction region and a third junction region disposed in the first active region,
wherein the first junction region and the second junction region are respectively disposed at first and second ends of the first active region,
wherein the first junction region and the second junction region are respectively provided adjacent to sidewalls of the floating gate and the selection gate, and
wherein the third junction region is disposed between the floating gate and the selection gate.

5. The nonvolatile memory device according to claim 4, wherein the first junction region, the second junction region and the third junction region each have n+ type conductivity.

6. The nonvolatile memory device according to claim 5, further comprising:
a p type well region disposed to surround the first active region.

7. The nonvolatile memory device according to claim 5, further comprising:
a p+ type contact region disposed in the second active region.

8. The nonvolatile memory device according to claim 7, wherein the p+ type contact region is coupled to the contact.

9. The nonvolatile memory device according to claim 4, wherein the well region has n type conductivity.

10. The nonvolatile memory device according to claim 1, wherein the first active region and the second active region are defined by an isolation layer.

11. The nonvolatile memory device according to claim 1, wherein the second capacitor in a vertical structure further comprises an insulation layer disposed between the well region and the floating gate.

12. A nonvolatile memory device comprising:
- a charge storage transistor including a floating gate, a first junction region which is coupled to a source line, and a third junction region;
- a selection transistor including a selection gate which is coupled to a word line, a second junction region which is coupled to a bit line, and the third junction region which is shared by the charge storage transistor;
- a first capacitor component disposed between a terminal of the selection gate and a terminal of the floating gate; and
- a diode component and a second capacitor component disposed in series between the terminal of the selection gate and the terminal of the floating gate.

13. The nonvolatile memory device according to claim 12, wherein the first capacitor component: and the second capacitor component are coupled to each other in parallel between the terminals of the selection gate and the floating gate.

14. The nonvolatile memory device according to claim 12, further comprising:
- a dielectric layer disposed between the floating gate and the selection gate, wherein the first capacitor component includes the floating gate, the dielectric layer and the selection gate.

15. The nonvolatile memory device according to claim 12, wherein an anode and a cathode of the diode component are respectively coupled to the selection gate and the second capacitor component.

16. The nonvolatile memory device according to claim 14, further comprising:
- a second-conductivity-type contact region coupled to the selection gate,
- a first-conductivity-type well region disposed under the floating gate to surround the second-conductivity-type contact region and partially overlap with the floating gate, and
- an insulation layer disposed between the first-conductivity-type well region and the floating gate,
- wherein the diode component comprises the second-conductivity-type contact region and the first-conductivity-type well region, and wherein the second capacitor component comprises the first-conductivity-type well region, the insulation layer and the floating gate, which are disposed vertically.

17. The nonvolatile memory device according to claim 12, wherein a bias voltage commonly applied to the word line is coupled to the floating gate by the first capacitor component: and the second capacitor component in such a manner that coupling voltages are induced.

18. The nonvolatile memory device according to claim 17, wherein programming is performed by applying a positive program voltage and a positive source voltage to the word line and the source line, respectively, and by connecting the bit line to the ground.

19. The nonvolatile memory device according to claim 17, wherein erasing is performed by applying a negative erase voltage and a positive source voltage to the word line and the source line, respectively, and by connecting the bit line to the ground.

20. The nonvolatile memory device according to claim 17, wherein reading is performed by applying a positive read voltage and a positive drain voltage to the word line and the bit line, respectively, and by connecting the source line to the ground.

* * * * *